(12) United States Patent
Sakashita et al.

(10) Patent No.: US 7,845,767 B2
(45) Date of Patent: Dec. 7, 2010

(54) PIEZOELECTRIC DEVICE, METHOD OF ACTUATING THE SAME, PIEZOELECTRIC APPARATUS, AND LIQUID DISCHARGE APPARATUS

(75) Inventors: Yukio Sakashita, Kanagawa-ken (JP);
Takamichi Fujii, Kanagawa-ken (JP);
Yoshikazu Hishinuma, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 503 days.

(21) Appl. No.: 12/065,934

(22) PCT Filed: Sep. 15, 2006

(86) PCT No.: PCT/JP2006/318791

§ 371 (c)(1),
(2), (4) Date: Mar. 6, 2008

(87) PCT Pub. No.: WO2007/034903

PCT Pub. Date: Mar. 29, 2007

(65) Prior Publication Data

US 2009/0267998 A1    Oct. 29, 2009

(30) Foreign Application Priority Data

Sep. 26, 2005 (JP) ............................. 2005-277108
Jul. 10, 2006 (JP) ............................. 2006-188765

(51) Int. Cl.
*B41J 2/045* (2006.01)
(52) U.S. Cl. ....................................... 347/68
(58) Field of Classification Search .................. 310/363
See application file for complete search history.

(56) References Cited

U.S. PATENT DOCUMENTS 5,804,907 A    9/1998 Park et al.

FOREIGN PATENT DOCUMENTS

| JP | 2000-326506 A | 11/2000 |
| JP | 3568107 B2 | 6/2004 |
| JP | 2005-93133 A | 4/2005 |
| WO | WO-98/33220 A1 | 7/1998 |

OTHER PUBLICATIONS

Park et al., "Ultrahigh strain and piezoelectric behavior in relaxor based ferroelectric single crystals," J. Appl. Phys., vol. 82, No. 4, 1997, pp. 1804-1811.

*Primary Examiner*—Matthew Luu
*Assistant Examiner*—Lisa M Solomon
(74) *Attorney, Agent, or Firm*—Birch, Stewart, Kolasch & Birch, LLP

(57) ABSTRACT

A piezoelectric device comprises a piezoelectric body and electrodes for applying an electric field in a predetermined direction across the piezoelectric body. The piezoelectric body contains an inorganic compound polycrystal, which contains first ferroelectric substance crystals having orientational characteristics at the time free from electric field application and has characteristics such that, with application of at least a predetermined electric field E1, at least part of the first crystals undergoes phase transition to second ferroelectric substance crystals of a crystal system different from the crystal system of the first crystals. The piezoelectric device is actuated under conditions such that a minimum applied electric field Emin and a maximum applied electric field Emax satisfy Emin<E1<Emax.

21 Claims, 8 Drawing Sheets

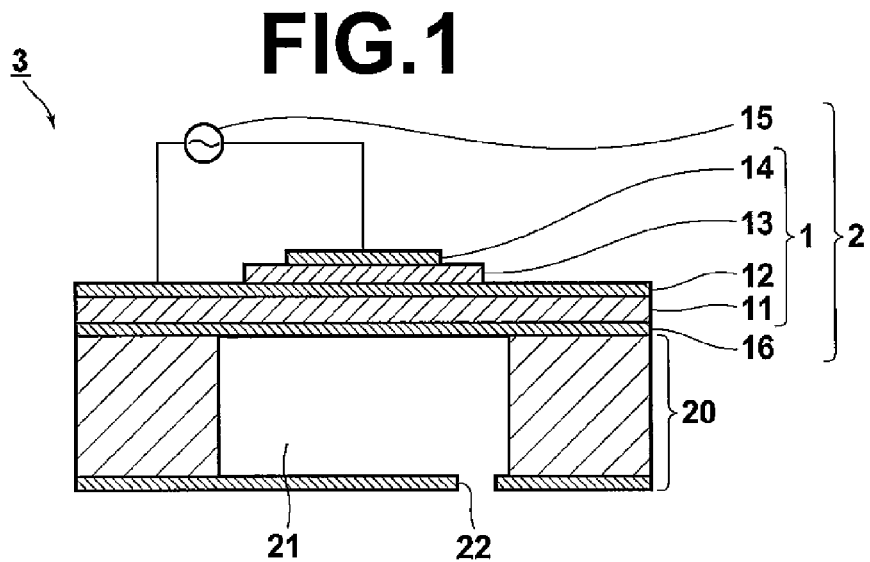
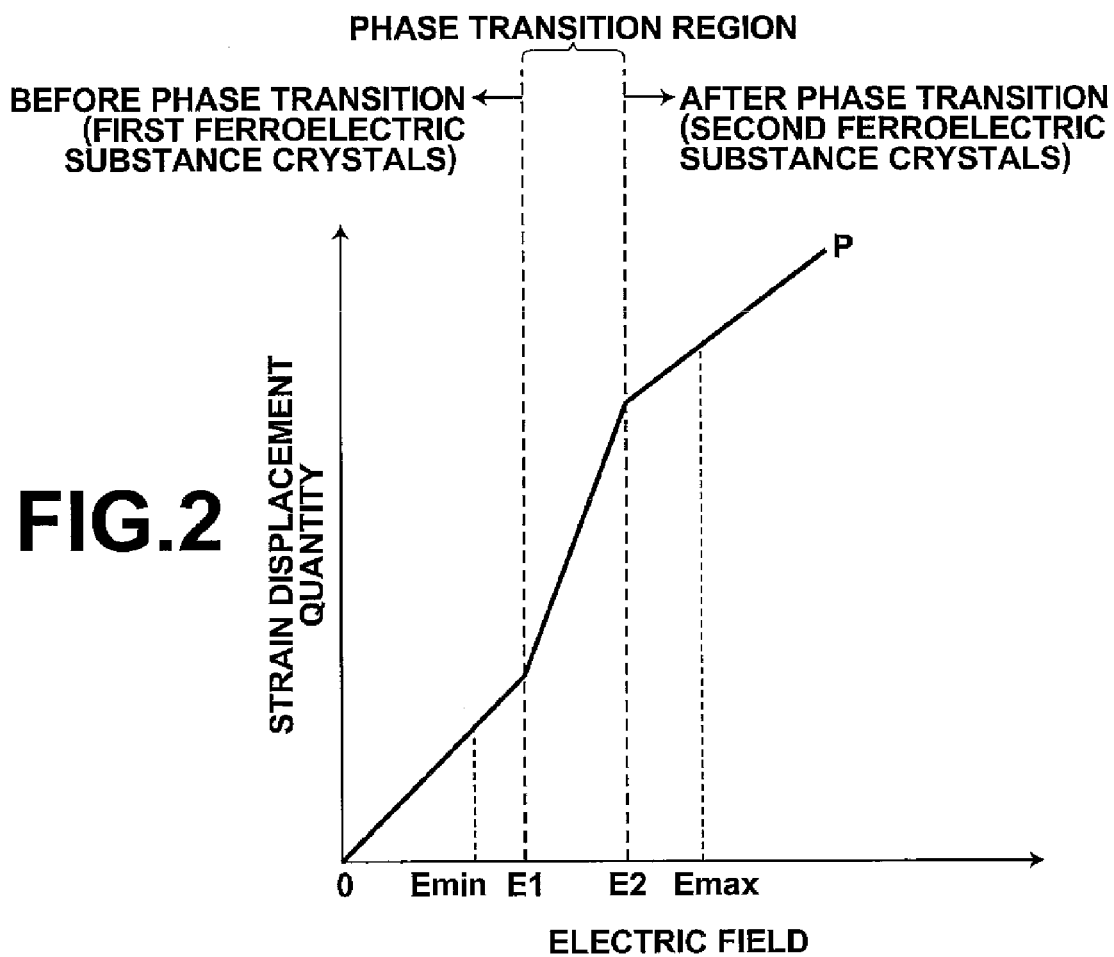

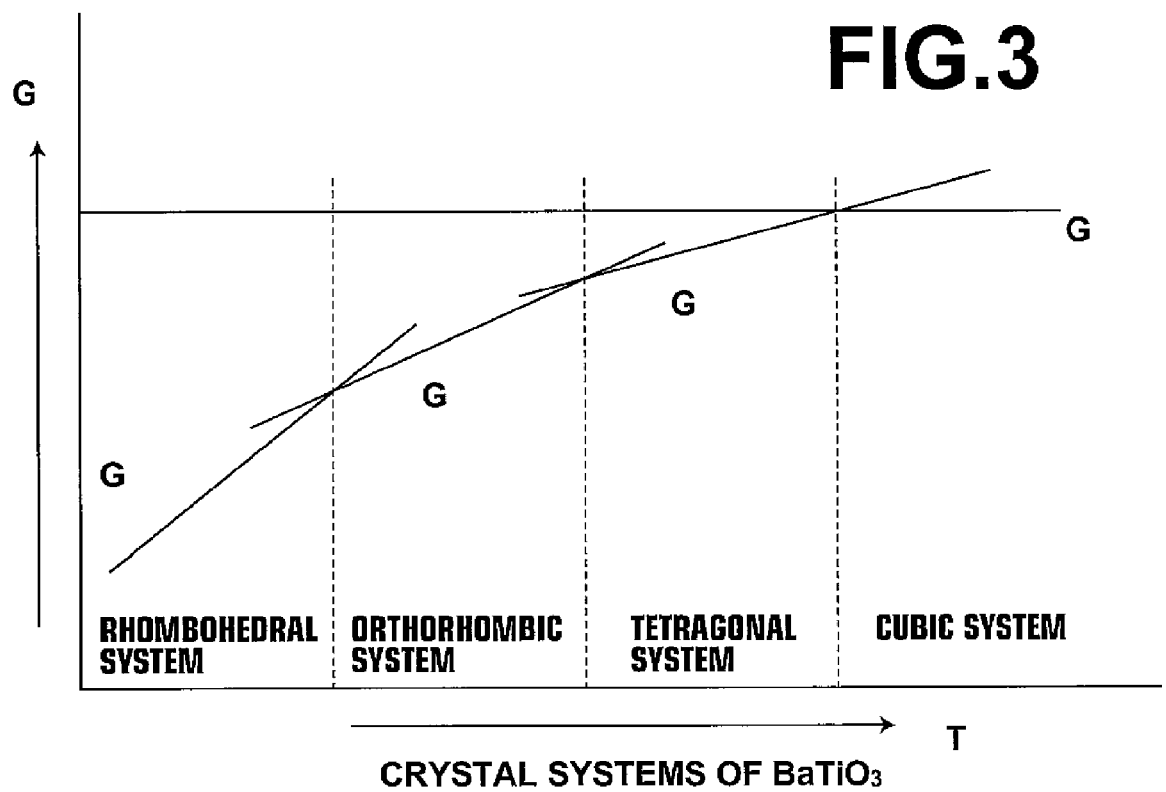

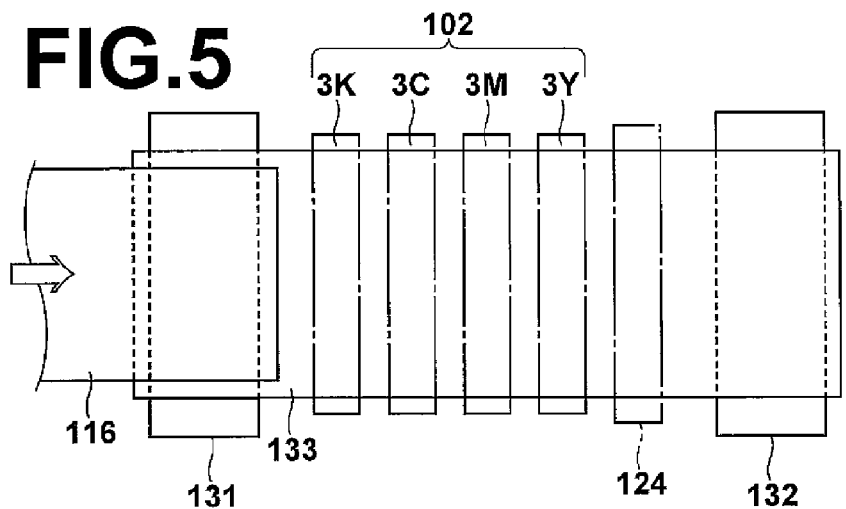
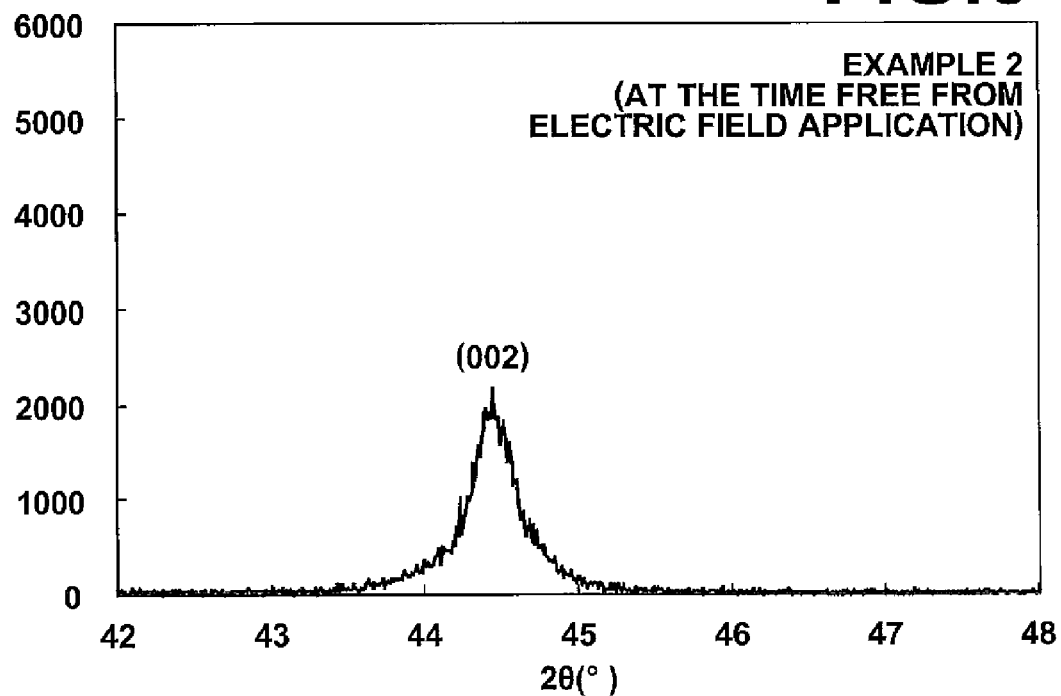

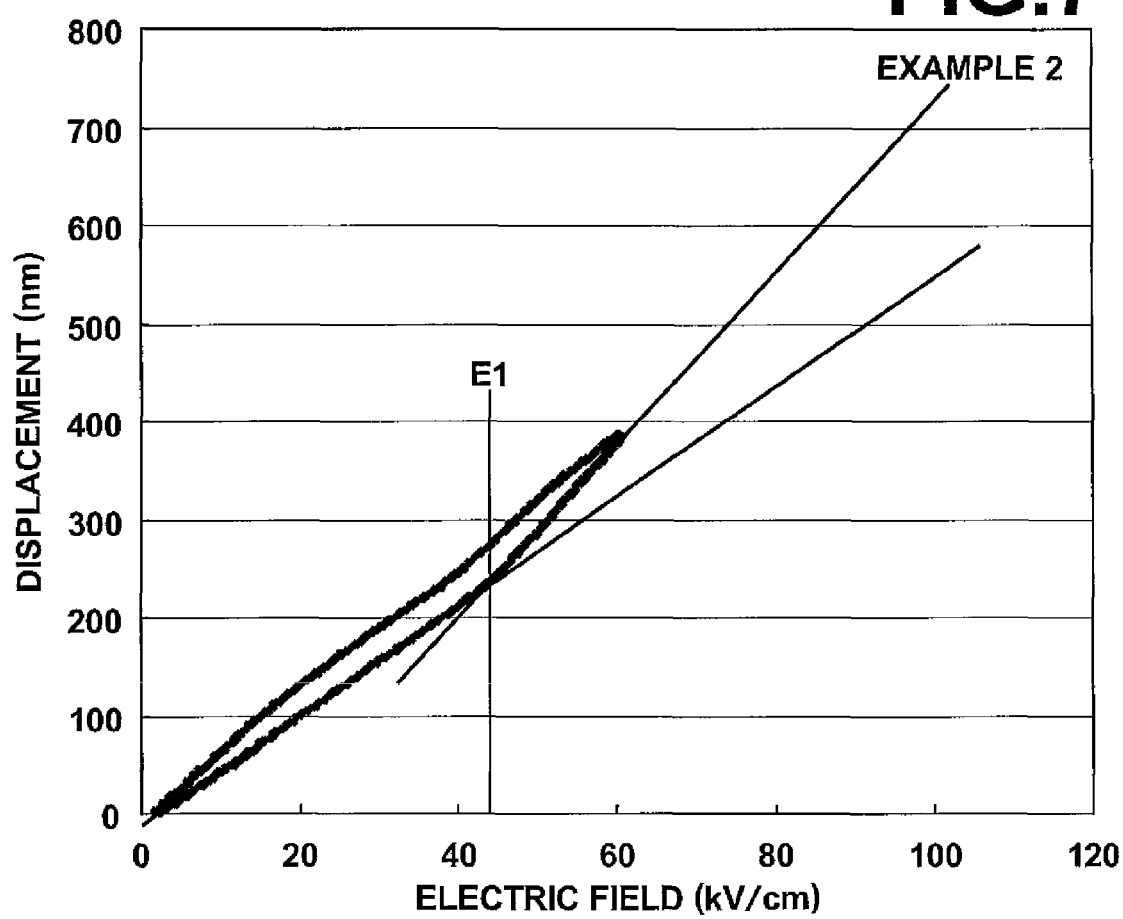

PIEZOELECTRIC DEVICE, METHOD OF ACTUATING THE SAME, PIEZOELECTRIC APPARATUS, AND LIQUID DISCHARGE APPARATUS

TECHNICAL FIELD

This invention relates to a piezoelectric device and a method of actuating the piezoelectric device. This invention particularly relates to a crystal structure of a piezoelectric body constituting the piezoelectric device and conditions, under which the piezoelectric device is actuated. This invention also relates to a piezoelectric apparatus, which is provided with the piezoelectric device and control means for controlling the actuation of the piezoelectric device, and a liquid discharge apparatus utilizing the piezoelectric apparatus.

BACKGROUND ART

Piezoelectric devices provided with a piezoelectric body, which has piezoelectric characteristics such that the piezoelectric body expands and contracts in accordance with an increase and a decrease in electric field applied across the piezoelectric body, and electrodes for applying the electric field in a predetermined direction across the piezoelectric body have heretofore been used as actuators to be loaded on ink jet type recording heads, and the like.

As piezoelectric body materials, there have heretofore been known composite oxides having a perovskite structure, such as lead zirconate titanate (PZT). The composite oxides having the perovskite structure are ferroelectric substances, which have spontaneous polarization characteristics at the time free from electric field application. With the conventional piezoelectric devices, ordinarily, an electric field is applied in a direction matched with a polarization axis of the ferroelectric substance, and a piezoelectric effect extending in the direction of the polarization axis is thereby utilized. (The technique for applying the electric field in the direction matched with the polarization axis of the ferroelectric substance will hereinbelow be referred to as the conventional technique 1.) Specifically, heretofore, it has been regarded to be important that material design be made such that the direction of the electric field application and the direction of the polarization axis may coincide with each other (i.e., polarization axis=direction of electric field application).

However, in cases where the aforesaid piezoelectric effect of the ferroelectric substances is merely utilized, a strain displacement quantity of the piezoelectric device is limited. Therefore, nowadays there is a strong demand for piezoelectric devices having an enhanced strain displacement quantity.

Also, with size reduction and weight reduction made in electronic equipment and enhancement of functions made in electronic equipment in recent years, there has arisen a tendency toward the reduction in size and weight of piezoelectric devices and enhancement of functions of the piezoelectric devices. For example, in the cases of the piezoelectric devices for use in the ink jet type recording heads, such that images having good image quality may be obtained, it has recently been studied to enhance array density of the piezoelectric devices. Further, such that the array density of the piezoelectric devices may be enhanced, it has recently been studied to reduce the thicknesses of the piezoelectric devices. However, in the cases of the piezoelectric devices having the reduced thicknesses, if a voltage is applied across the piezoelectric device in the same manner as that for the conventional piezoelectric devices, the applied electric field exerted upon the piezoelectric body will become high. Therefore, in such cases, if the same material design as in the conventional piezoelectric devices is made directly, a sufficient piezoelectric effect will not be capable of being obtained.

FIG. 11 is a graph showing piezoelectric characteristics of piezoelectric bodies constituting conventional piezoelectric devices. It has heretofore been known that the piezoelectric characteristics (i.e., the relationship between the applied electric field and the strain displacement quantity), which are obtained from the aforesaid piezoelectric effect of the ferroelectric substance, may be represented approximately by a curve Q (conventional technique 1) as illustrated in FIG. 11. The curve Q indicates that, as for the applied electric field range of zero to a certain applied electric field Ex, the strain displacement quantity increases linearly with respect to the increase in applied electric field. The curve Q also indicates that, as for the applied electric field range higher than the certain applied electric field Ex, the increase in strain displacement quantity with respect to the increase in applied electric field becomes markedly small, and saturation is approximately reached in strain displacement quantity.

Heretofore, the piezoelectric devices have been used with the applied electric field falling within the range of 0 to Ex, in which range the strain displacement quantity increases linearly with respect to the increase in applied electric field. (For example, Ex takes a value of approximately 5 kV/cm to approximately 100 kV/cm, depending upon the kinds of the materials of the piezoelectric bodies, and the maximum applied electric field takes a value of approximately 0.1 kV/cm to approximately 10 kV/cm, depending upon the kinds of the materials of the piezoelectric bodies.) However, as for the piezoelectric devices having the reduced thicknesses, in cases where the voltage is applied across the piezoelectric device in the same manner as that for the conventional piezoelectric devices, the applied electric field exerted upon the piezoelectric body becomes high. Therefore, in such cases, the piezoelectric devices having the reduced thicknesses are used with the applied electric field falling within the range of, for example, 0 to Ey, where Ey>Ex. In such cases, a substantial piezoelectric constant may be represented by the inclination indicated by the broken line Q' in FIG. 11. Specifically, in such cases, the substantial piezoelectric constant is smaller than the piezoelectric constant with respect to the applied electric field range of 0 to Ex, and the piezoelectric characteristics, which the piezoelectric devices originally have, are not capable of being utilized sufficiently.

Particularly, in cases where the difference between the minimum applied electric field and the maximum applied electric field is set at a level identical with the level in the conventional techniques, for example, in cases where the piezoelectric devices are used with the applied electric field falling within the range of Ex to Ey, the piezoelectric devices are used within the applied electric field range, in which little strain displacement is capable of being obtained, and therefore sufficient functions of the piezoelectric devices are not capable of being utilized.

In view of the above circumstances, a piezoelectric device, in which the piezoelectric body is caused by electric field application to undergo phase transition, has been proposed in, for example, Japanese Patent No. 3568107. (The piezoelectric device proposed in, for example, Japanese Patent No. 3568107 will hereinbelow be referred to as the conventional technique 2.) Japanese Patent No. 3568107 discloses a piezoelectric device comprising a phase transition film, electrodes, and a heating element for adjusting the temperature of the phase transition film at a temperature T in the vicinity of a Curie temperature Tc. (Reference may be made to Claim 1 of Japanese Patent No. 3568107.) Also, in Japanese Patent No. 3568107, as the phase transition film, there is mentioned a film, which undergoes the transition between a tetraqonal system and a rhombohedral system, or the transition between the rhombohedral system or the tetragonal system and a cubic system. (Reference may be made to Claim 2 of Japanese Patent No. 3568107.)

In Japanese Patent No. 3568107, it is described that, with the piezoelectric device in accordance with the invention of Japanese Patent No. 3566107, a strain displacement quantity larger than with conventional piezoelectric devices is capable of being obtained by virtue of a piezoelectric effect of a ferroelectric substance and a volume change due to a change of a crystal structure accompanying the phase transition.

In Japanese Patent No. 3568107, as the phase transition film, there are mentioned the film undergoing the phase transition between the tetragonal system and the rhombohedral system, each of which constitutes the ferroelectric substance, and the film undergoing the phase transition between the rhombohedral system or the tetragonal system, which constitutes the ferroelectric substance, and the cubic system, which constitutes a paraelectric substance. However, the piezoelectric device (the conventional technique 2) described in Japanese Patent No. 3568107 is the one used at the temperature in the vicinity of the Curie temperature Tc. The Curie temperature Tc corresponds to the phase transition temperature between the ferroelectric substance and the paraelectric substance. Therefore, in cases where the piezoelectric device is used at the temperature in the vicinity of the Curie temperature Tc, the phase transition film will not be capable of undergoing the phase transition between tetragonal system and the rhombohedral system. Accordingly, the piezoelectric device described in Japanese Patent No. 3568107 will be the one utilizing the phase transition between the ferroelectric substance and the paraelectric substance. With the piezoelectric device utilizing the phase transition between the ferroelectric substance and the paraelectric substance, since the paraelectric substance does not have the spontaneous polarization characteristics, after the phase transition has occurred, the piezoelectric effect extending in the direction of the polarization axis will not be capable of being obtained from the electric field application.

The piezoelectric characteristics of the piezoelectric device described in Japanese Patent No. 3568107 may be approximately represented by the curve R (conventional technique 2) as illustrated in FIG. 11. In FIG. 11, as an aid in facilitating the comparison, the piezoelectric characteristics before the phase transition occurs, which piezoelectric characteristics are represented by the curve R, are illustrated as being identical with the piezoelectric characteristics before the phase transition occurs, which piezoelectric characteristics are represented by the curve Q corresponding to the aforesaid conventional technique 1 utilizing only the piezoelectric effect of the ferroelectric substance. The curve R indicates that, as for the applied electric field range before the phase transition occurs, the strain displacement quantity increases linearly with respect to the increase in applied electric field due to the piezoelectric effect of the ferroelectric substance. The curve R also indicates that, as for the applied electric field range of an applied electric field E1, at which the phase transition begins, to an applied electric field E2, at which the phase transition is approximately completed, the strain displacement quantity increases due to the change of the crystal structure accompanying the phase transition. The curve R further indicates that, as for the applied electric field range higher than the applied electric field E2, at which the phase transition to the paraelectric substance is approximately completed, since the piezoelectric effect of the ferroelectric substance is not capable of being obtained any more, the strain displacement quantity does not increase with further application of the electric field.

With the conventional technique 2, as in the cases of the aforesaid conventional technique 1 utilizing only the piezoelectric effect of the ferroelectric substance, if the thickness of the piezoelectric device is reduced, the piezoelectric device having the reduced thickness will be used with the applied electric field containing the range of the high applied electric field, in which range little strain displacement quantity is obtained, and the operation efficiency will not be capable of being kept high.

In view of the above circumstances, the primary object of the present invention is to provide a piezoelectric device, which is capable of reliably yielding a large strain displacement quantity and is capable of coping with reduction in thickness.

An other object of the present invention is to provide a method of actuating the piezoelectric device.

A further object of the present invention is to provide a piezoelectric apparatus, which is provided with the piezoelectric device and control means for controlling the actuation of the piezoelectric device.

The specific object of the present invention is to provide a liquid discharge apparatus utilizing the piezoelectric apparatus.

DISCLOSURE OF INVENTION

The present invention provides a piezoelectric device, comprising:

i) a piezoelectric body, which has piezoelectric characteristics, and ii) electrodes for applying an electric field in a predetermined direction across the piezoelectric body, the piezoelectric body containing an inorganic compound polycrystal, which contains first ferroelectric substance crystals having crystal orientational characteristics at the time free from electric field application, and which has characteristics such that, with electric field application of at least a predetermined electric field E1, at least a part of the first ferroelectric substance crystals undergoes phase transition to second ferroelectric substance crystals of a crystal system different from the crystal system of the first ferroelectric substance crystals, the piezoelectric device being actuated under conditions such that a minimum applied electric field Emin and a maximum applied electric field Emax satisfy Formula (1):

$$Emin < E1 < Emax \tag{1}$$

wherein the electric field E1 represents the minimum electric field at which the phase transition from the first ferroelectric substance crystals to the second ferroelectric substance crystals begins.

In the piezoelectric device in accordance with the present invention, the piezoelectric body may be constituted of the inorganic compound polycrystal, which consists of the first ferroelectric substance crystals at the time free from electric field application. Alternatively, the piezoelectric body may be constituted of the inorganic compound polycrystal, which contains a mixture of the first ferroelectric substance crystals and other ferroelectric substance crystals of a crystal system different from the crystal system of the first ferroelectric substance crystals at the time free from electric field application.

The term "first ferroelectric substance crystals having crystal orientational characteristics" as used herein means that an orientation rate F, as measured with a Lotgering method, of the first ferroelectric substance crystals is equal to at least 80%.

The orientation rate F may be represented by Formula (i) shown below.

$$F(\%) = (P-P0)/(1-P0) \times 100 \qquad (i)$$

In Formula (i), P represents the ratio of the sum total of reflection intensities from the plane of orientation to the sum total of the all reflection intensities. In the cases of the (001) orientation, P represents the ratio, $\{\Sigma I(001)/\Sigma I(hkl)\}$, of the sum total $\Sigma I(001)$ of the reflection intensities I(001) from the (001) face to the sum total $\Sigma I(hkl)$ of the reflection intensities I(hkl) from the respective crystal faces (hkl). For example, as for perovskite crystals, in the cases of the (001) orientation, the ratio P is calculated with the formula P=I(001)/[I(001)+I(100)+I(101)+I(110)+I(111).]

Also, in Formula (i), P0 represents P of a sample having undergone perfectly random orientation.

In the cases of the sample having undergone perfectly random orientation (P=P0), the orientation rate F is equal to 0%. Also, in the cases of a sample having undergone perfect orientation (P=1), the orientation rate F is equal to 100%.

In, for example, Japanese Patent No. 3568107 (the conventional technique 2) described above, nothing is mentioned with regard to the crystal orientational characteristics. Heretofore, ceramics sintered bodies having nonuniform structures have been utilized as the piezoelectric bodies, and there has thus been no conception with regard to the utilization of the piezoelectric body having the crystal orientational characteristics.

The piezoelectric device in accordance with the present invention should preferably be modified such that the piezoelectric device is actuated under conditions such that the minimum applied electric field Emin and the maximum applied electric field Emax satisfy Formula (2):

$$\text{Emin} < E1 \leq E2 < \text{Emax} \qquad (2)$$

wherein the electric field E2 represents the electric field at which the phase transition from the first ferroelectric substance crystals to the second ferroelectric substance crystals finishes approximately perfectly.

The term "electric field E2 at which phase transition from first ferroelectric substance crystals to second ferroelectric substance crystals finishes approximately perfectly" as used herein means the electric field such that further phase transition does not occur with the further application of a higher electric field. It may often occur that, in cases where an electric field higher than E2 is applied across the piezoelectric body, a part of the first ferroelectric substance crystals remains as the first ferroelectric substance crystals without undergoing the phase transition to the second ferroelectric substance crystals.

Also, the piezoelectric device in accordance with the present invention should preferably be modified such that a direction of a polarization axis of the first ferroelectric substance crystals is different from the direction of the electric field application by the electrodes. Particularly, the piezoelectric device in accordance with the present invention should preferably be modified such that the direction of the electric field application approximately coincides with the direction of the polarization axis of the second ferroelectric substance crystals.

The term "direction of electric field application approximately coincides with a direction of polarization axis of second ferroelectric substance crystals" as used herein means that the deviation between the direction of the electric field application and the direction of the polarization axis of the second ferroelectric substance crystals falls within the range of ±20°.

As described above with reference to the conventional piezoelectric devices (the conventional technique 1), in which only the piezoelectric effect of the ferroelectric substance is utilized, it has heretofore been regarded to be important that the electric field is applied in the direction matched with the polarization axis of the ferroelectric substance. If the aforesaid technique for applying the electric field in the direction matched with the polarization axis of the ferroelectric substance is directly applied to the system in accordance with the present invention, in which the first ferroelectric substance crystals are caused to undergo the phase transition to the second ferroelectric substance crystals, the electric field will be applied in the direction matched with the polarization axis of the first ferroelectric substance crystals before undergoing the phase transition.

With the piezoelectric device in accordance with the present invention, in contrast to the aforesaid conventional technique 1, the direction of the polarization axis of the first ferroelectric substance crystals and the direction of the electric field application by the electrodes are set to be different from each other. Also, preferably, the direction of the electric field application is set to be approximately identical with the direction of the polarization axis of the second ferroelectric substance crystals. With the piezoelectric device in accordance with the present invention, an "engineered domain effect," or the like, is thus capable of being obtained preferably.

The "engineered domain effect of single crystals" is described in, for example, a literature "Ultra high strain and piezoelectric behavior in relaxor based ferroelectric single crystals," S. E. Park, et al., JAP, 82, 1804 (1997).

In the aforesaid literature, the "engineered domain effect" is described as the effect such that, with respect to a PZN-8% PT single crystal, in cases where phase transition from a first ferroelectric substance crystal (of the rhombohedral system) to a second ferroelectric substance crystal (of the tetragonal system) is performed such that the direction of the polarization axis of the first ferroelectric substance crystal and the direction of the electric field application may be different from each other, and such that the direction of the electric field application may be matched with the direction of the polarization axis of the second ferroelectric substance crystal, a larger displacement quantity is capable of being obtained than in cases where the direction of the electric field application is matched with the direction of the polarization axis of the first ferroelectric substance crystal.

FIG. 12 shows the piezoelectric characteristics illustrated in FIG. 17 of the aforesaid literature. In the aforesaid literature, it is described that, within the range of Step A and Step B, i.e. within the range before the phase transition is completed approximately, by virtue of the engineered domain effect, a larger displacement quantity is capable of being obtained than in cases where the direction of the electric field application is matched with the direction of the polarization axis of the first ferroelectric substance crystal. In the aforesaid literature, nothing is manifested with regard to why the engineered domain effect arises.

However, in the aforesaid literature, nothing is particularly discussed with regard to the piezoelectric characteristics at the stage after the phase transition has finished approximately perfectly. Also, nothing is mentioned with regard to a polycrystal itself. Nothing is thus mentioned with regard to the polycrystal having the crystal orientational characteristics, which polycrystal is employed in the piezoelectric device in accordance with the present invention. Further, nothing is mentioned with regard to a technique such as that the actuation is performed with the minimum applied electric field and the maximum applied electric field being set within specific ranges. Specifically, in the aforesaid literature, though the "engineered domain effect of single crystals" is reported, the effect is merely reported, and nothing is mentioned with regard to the application to a polycrystal, definite utilization as a piezoelectric device, and the like.

In the piezoelectric device in accordance with the present invention, the combination of the kind of the first ferroelectric substance crystals and the kind of the second ferroelectric substance crystals may be such that the first ferroelectric substance crystals are selected from the group consisting of tetragonal system crystals, orthorhombic system crystals, and rhombohedral system crystals, and the second ferroelectric substance crystals are selected from the group consisting of tetragonal system crystals, orthorhombic system crystals, and rhombohedral system crystals and are of the crystal system different from the crystal system of the first ferroelectric substance crystals.

The polarization axes of the ferroelectric substance crystals are as shown below.

Tetragonal system: <001>
Orthorhombic system: <110>
Rhombohedral system: <111>

Ordinarily, the direction of the electric field application is set in the thickness direction of the piezoelectric body (the direction normal to the surface of the piezoelectric body, i.e., the direction of the orientation).

In cases where the aforesaid polarization axis is taken into consideration, examples of the combinations of the first ferroelectric substance crystals and the second ferroelectric substance crystals, such that the direction of the electric field application (the direction of the orientation) approximately coincides with the direction of the polarization axis of the second ferroelectric substance crystals after the phase transition has occurred, include the combinations (1) to (6) shown below.

(1) A combination, in which the first ferroelectric substance crystals are the rhombohedral system crystals having the crystal orientational characteristics in an approximately <001> direction, and the second ferroelectric substance crystals are the tetragonal system crystals.

(2) A combination, in which the first ferroelectric substance crystals are the tetragonal system crystals having the crystal orientational characteristics in an approximately <111> direction, and the second ferroelectric substance crystals are the rhombohedral system crystals.

(3) A combination, in which the first ferroelectric substance crystals are the orthorhombic system crystals having the crystal orientational characteristics in an approximately <001> direction, and the second ferroelectric substance crystals are the tetragonal system crystals.

(4) A combination, in which the first ferroelectric substance crystals are the tetragonal system crystals having the crystal orientational characteristics in an approximately <110> direction, and the second ferroelectric substance crystals are the orthorhombic system crystals.

(5) A combination, in which the first ferroelectric substance crystals are the rhombohedral system crystals having the crystal orientational characteristics in an approximately <110> direction, and the second ferroelectric substance crystals are the orthorhombic system crystals.

(6) A combination, in which the first ferroelectric substance crystals are the orthorhombic system crystals having the crystal orientational characteristics in an approximately <111> direction, and the second ferroelectric substance crystals are the rhombohedral system crystals.

The term "first ferroelectric substance crystals having crystal orientational characteristics in an approximately <abc> direction" as used herein means that the orientation rate F is equal to at least 80%.

In the piezoelectric device in accordance with the present invention, the piezoelectric body may contain at least one kind of perovskite type oxide, which may contain inevitable impurities.

In such cases, the piezoelectric body should preferably contain at least one kind of perovskite type oxide, which may contain inevitable impurities, the perovskite type oxide being represented by the general formula:

general formula $ABO_3$ wherein A represents the element at the A site and represents at least one kind of element selected from the group consisting of Pb, Ba, La, Sr, Bi, Li, Na, Ca, Cd, Mg, and K, B represents the element at the B site and represents at least one kind of element selected from the group consisting of Ti, Zr, V, Nb, Ta, Cr, Mo, W, Mn, Sc, Co, Cu, In, Sn, Ga, Zn, Cd, Fe, Ni, and lanthanide elements, and O represents the oxygen atom, the standard composition being such that the number of mols of the A site element is 1.0, and at the same time the number of mols of the B site element is 1.0, with the proviso that each of the number of mols of the A site element and the number of mols of the B site element may deviate from 1.0 within a range such that the perovskite structure is capable of being attained.

Also, the piezoelectric device in accordance with the present invention should preferably be modified such that a phase transition temperature, at which the phase transition from the first ferroelectric substance crystals of the piezoelectric body to the second ferroelectric substance crystals occurs, falls within the range of −50° C. to +200° C.

Further, the piezoelectric device in accordance with the present invention may be modified such that the piezoelectric body is a piezoelectric film having a film thickness of at most 20 μm.

Furthermore, the piezoelectric device in accordance with the present invention may be modified such that the piezoelectric body contains a particulate orientational ceramics sintered body.

The present invention also provides a method of actuating a piezoelectric device provided with:

i) a piezoelectric body, which has piezoelectric characteristics, and ii) electrodes for applying an electric field in a predetermined direction across the piezoelectric body, the piezoelectric body containing an inorganic compound polycrystal, which contains first ferroelectric substance crystals having crystal orientational characteristics at the time free from electric field application, and which has characteristics such that, with electric field application of at least a predetermined electric field E1, at least a part of the first ferroelectric substance crystals undergoes phase transition to second ferroelectric substance crystals of a crystal system different from the crystal system of the first ferroelectric substance crystals, the method comprising the steps of: actuating the piezoelectric device under conditions such that a minimum applied electric field Emin and a maximum applied electric field Emax satisfy Formula (1):

$$\text{Emin} < \text{E1} < \text{Emax} \tag{1}$$

wherein the electric field E1 represents the minimum electric field at which the phase transition from the first ferroelectric substance crystals to the second ferroelectric substance crystals begins.

The method of actuating a piezoelectric device in accordance with the present invention should preferably be modified such that the piezoelectric device is actuated under conditions such that the minimum applied electric field Emin and the maximum applied electric field Emax satisfy Formula (2):

$$\text{Emin} < \text{E1} \leq \text{E2} < \text{Emax} \tag{2}$$

wherein the electric field E2 represents the electric field at which the phase transition from the first ferroelectric substance crystals to the second ferroelectric substance crystals finishes approximately perfectly.

The present invention further provides a piezoelectric apparatus, comprising:

i) a piezoelectric device provided with:
a) a piezoelectric body, which has piezoelectric characteristics, and
b) electrodes for applying an electric field in a predetermined direction across the piezoelectric body, and ii) control means for controlling actuation of the piezoelectric device, the piezoelectric body containing an inorganic compound polycrystal, which contains first ferroelectric substance crystals having crystal orientational characteristics at the time free from electric field application, and which has characteristics such that, with electric field application of at least a predetermined electric field E1, at least a part of the first ferroelectric substance crystals undergoes phase transition to second ferroelectric substance crystals of a crystal system different from the crystal system of the first ferroelectric substance crystals, the control means actuating the piezoelectric device under conditions such that a minimum applied electric field Emin and a maximum applied electric field Emax satisfy Formula (1):

$$\text{Emin} < \text{E1} < \text{Emax} \tag{1}$$

wherein the electric field E1 represents the minimum electric field at which the phase transition from the first ferroelectric substance crystals to the second ferroelectric substance crystals begins.

The piezoelectric apparatus in accordance with the present invention should preferably be modified such that the control means actuates the piezoelectric device under conditions such that the minimum applied electric field Emin and the maximum applied electric field Emax satisfy Formula (2):

$$\text{Emin} < \text{E1} \leq \text{E2} < \text{Emax} \tag{2}$$

wherein the electric field E2 represents the electric field at which the phase transition from the first ferroelectric substance crystals to the second ferroelectric substance crystals finishes approximately perfectly.

The present invention still further provides a liquid discharge apparatus, comprising:

i) a piezoelectric apparatus in accordance with the present invention, and ii) a liquid storing and discharging member provided with:

a) a liquid storing chamber, in which a liquid is to be stored, and b) a liquid discharge opening, through which the liquid is to be discharged from the liquid storing chamber to the exterior of the liquid storing chamber.

The piezoelectric device in accordance with the present invention comprises the piezoelectric body containing the inorganic compound polycrystal, which contains the first ferroelectric substance crystals having the crystal orientational characteristics at the time free from electric field application, and which has the characteristics such that, with electric field application of at least the predetermined electric field E1, at least a part of the first ferroelectric substance crystals undergoes the phase transition to the second ferroelectric substance crystals of the crystal system different from the crystal system of the first ferroelectric substance crystals. The piezoelectric device in accordance with the present invention is actuated under the conditions such that the minimum applied electric field Emin and the maximum applied electric field Emax satisfy Formula (1):

$$\text{Emin} < \text{E1} < \text{Emax} \tag{1}$$

wherein the electric field E1 represents the minimum electric field at which the phase transition from the first ferroelectric substance crystals to the second ferroelectric substance crystals begins.

The piezoelectric device in accordance with the present invention should preferably be actuated under the conditions such that the minimum applied electric field Emin and the maximum applied electric field Emax satisfy Formula (2):

$$\text{Emin} < \text{E1} \leq \text{E2} < \text{Emax} \tag{2}$$

wherein the electric field E2 represents the electric field at which the phase transition from the first ferroelectric substance crystals to the second ferroelectric substance crystals finishes approximately perfectly.

With the piezoelectric device in accordance with the present invention, the volume change due to the change of the crystal structure accompanying the phase transition of the piezoelectric body is capable of being obtained. Also, the piezoelectric body contains the ferroelectric substance crystals at both the stage before the phase transition occurs and the stage after the phase transition has occurred. Therefore, the piezoelectric effect of the ferroelectric substance is capable of being obtained at both the stage before the phase transition occurs and the stage after the phase transition has occurred. Accordingly, in both the cases wherein the piezoelectric device is actuated under the conditions satisfying Formula (1) shown above and the cases wherein the piezoelectric device is actuated under the conditions satisfying Formula (2) shown above, a large strain displacement quantity is capable of being obtained as a whole.

With the piezoelectric device in accordance with the present invention, the first ferroelectric substance crystals, which are the ferroelectric substance crystals before undergoing the phase transition, are the crystals having the crystal orientational characteristics. Therefore, the phase transition from the first ferroelectric substance crystals to the second ferroelectric substance crystals is capable of proceeding reliably, and the large strain displacement quantity is capable of being obtained reliably.

The aforesaid constitution of the piezoelectric device in accordance with the present invention is advantageous over the cases, wherein bulk single crystals are utilized, from the view point of production easiness, a low cost, high flexibility in shape design, and the like. Also, in cases where the thickness of the piezoelectric device is set to be thin, since a single crystal base plate requiring a high cost need not be utilized, the flexibility in selection of the base plate is capable of being kept high. The high flexibility in selection of the base plate is advantageous from the view point of a low cost, high flexibility in selection of a process, and the like.

In cases where a comparison is made between the piezoelectric device in accordance with the present invention and the conventional piezoelectric devices (the aforesaid conventional technique 1), which are provided with piezoelectric bodies having compositions represented by similar chemical formulas, the piezoelectric device in accordance with the present invention is actuated under the conditions such that the maximum applied electric field Emax is identical with or higher than the maximum applied electric field for the conventional piezoelectric devices (the aforesaid conventional technique 1), in which only the piezoelectric effect of the ferroelectric substance is utilized. Therefore, the piezoelectric device in accordance with the present invention is applicable also to a thin type piezoelectric device, in which a high applied electric field arises in cases where a voltage of the level identical with the level in the conventional techniques is applied across the piezoelectric body. Specifically, the piezoelectric device in accordance with the present invention is capable of coping with reduction in thickness.

The piezoelectric device in accordance with the present invention should preferably be modified such that the direction of the polarization axis of the first ferroelectric substance crystals is different from the direction of the electric field application by the electrodes. Particularly, the piezoelectric device in accordance with the present invention should preferably be modified such that the direction of the electric field application approximately coincides with the direction of the polarization axis of the second ferroelectric substance crystals. In such cases, the "engineered domain effect" arises, and the phase transition proceeds efficiently. Therefore, a large strain displacement quantity is capable of being obtained reliably.

BRIEF DESCRIPTION OF DRAWINGS

FIG. 1 is a sectional view showing a major part of an ink jet type recording head (acting as a liquid discharge apparatus), which is provided with an embodiment of the piezoelectric device in accordance with the present invention, FIG. 2 is a graph showing piezoelectric characteristics of a piezoelectric body of the piezoelectric device shown in FIG. 1, FIG. 3 is a graph showing relationships among a temperature T, Gibbs free energy G, and crystal systems of barium titanate, FIG. 5 is a plan view showing a part of the ink jet type recording system of FIG. 4, FIG. 6 is a graph showing an XRD pattern of a piezoelectric film, which was obtained in Example 2, at the time free from electric field application, FIG. 7 is a graph showing an electric field—displacement curve, which was obtained in cases where a piezoelectric device having been obtained in Example 2 was actuated under conditions of Emin=0 kV/cm (<E1) to Emax=60 kV/cm (>E1)

BEST MODE FOR CARRYING OUT THE INVENTION

Figure 4:
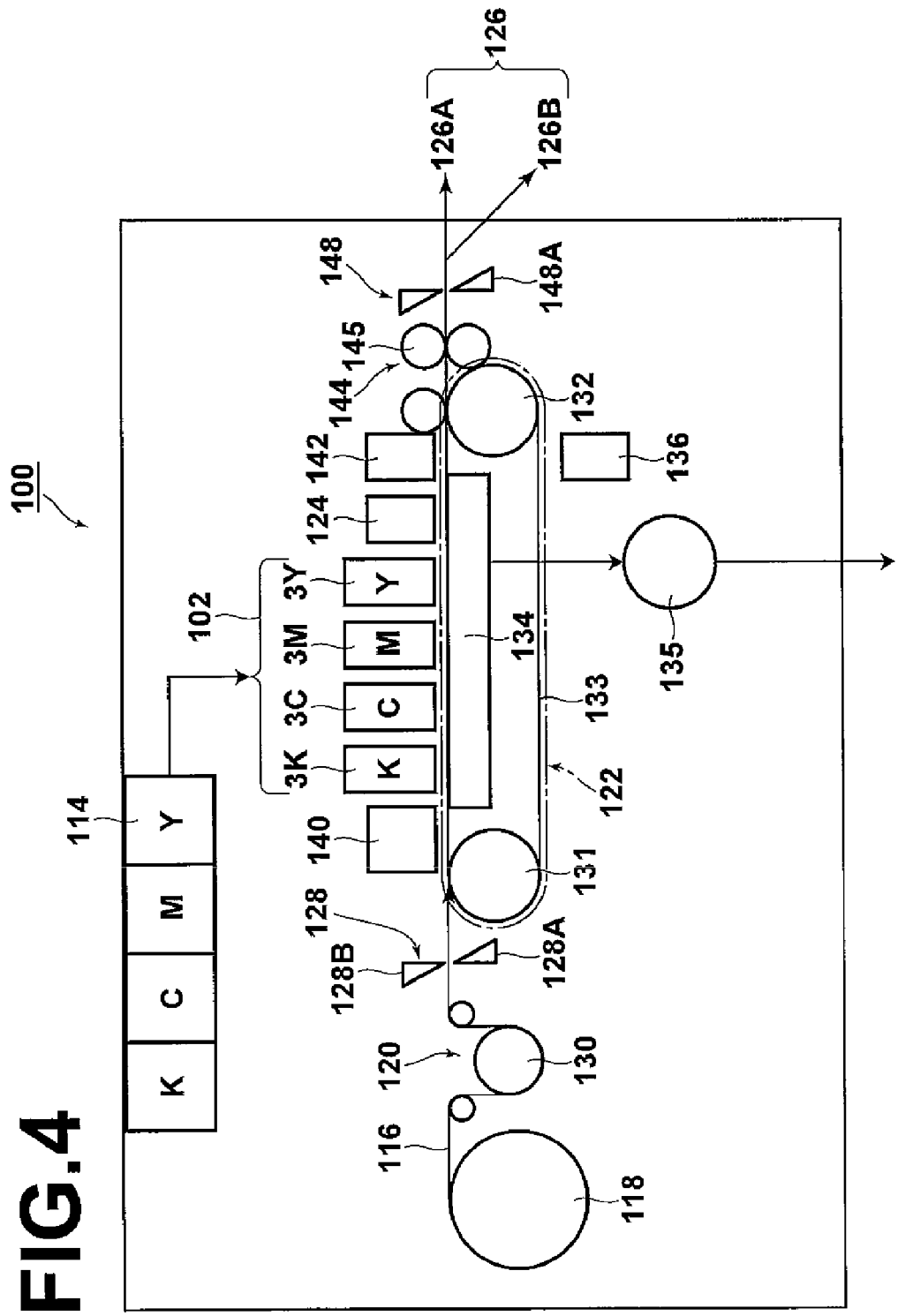
FIG. 4 is a schematic view showing an example of an ink jet type recording system, in which the ink jet type recording head of FIG. 1 is employed.

The present invention will hereinbelow be described in further detail with reference to the accompanying drawings.

[Piezoelectric Device]

[Piezoelectric Device, Piezoelectric Actuator, and Ink Jet Type Recording Head]

An embodiment of the piezoelectric device in accordance with the present invention, a piezoelectric actuator (acting as the piezoelectric apparatus in accordance with the present invention), which is provided with the embodiment of the piezoelectric device in accordance with the present invention, and an ink jet type recording head (acting as the liquid discharge apparatus in accordance with the present invention) will be described hereinbelow with reference to the accompanying drawings. FIG. 1 is a sectional view showing a major part of an ink jet type recording head (acting as a liquid discharge apparatus), which is provided with an embodiment of the piezoelectric device in accordance with the present invention, the sectional view being taken in the thickness direction of the piezoelectric device. In FIG. 1, for clearness, reduced scales of constituent elements of the ink jet type recording head are varied from actual reduced scales.

With reference to FIG. 1, a piezoelectric device 1 comprises a base plate 11. The piezoelectric device 1 also comprises a bottom electrode 12, a piezoelectric body 13, and a top electrode 14, which are overlaid in this order on a surface of the base plate 11. The piezoelectric body 13 contains an inorganic compound polycrystal having piezoelectric characteristics. An electric field is capable of being applied by the bottom electrode 12 and the top electrode 14 in the thickness direction of the piezoelectric body 13.

No limitation is imposed upon a material of the base plate 11. Examples of the materials of the base plate 11 include silicon, glass, stainless steel (SUS), and yttrium stabilized zirconia (YSZ). The base plate 11 may also be constituted of a laminate base plate, such as an SOI base plate, which contains an $SiO_2$ film and an Si active layer laminated in this order on a silicon base plate.

No limitation is imposed upon a principal constituent of the bottom electrode 12. Examples of the principal constituents of the bottom electrode 12 include metals, such as Au, Pt, and Ir; metal oxides, such as $IrO_2$, $RuO_2$, $LaNiO_3$, and $SrRuO_3$; and combinations of the above-enumerated metals and/or the above-enumerated metal oxides. Also, no limitation is imposed upon a principal constituent of the top electrode 14. Examples of the principal constituents of the top electrode 14 include the materials exemplified above for the bottom electrode 12; electrode materials ordinarily utilized in semiconductor processes, such as Al, Ta, Cr, and Cu; and combinations of the materials exemplified above for the bottom electrode 12 and/or the above-enumerated electrode materials. No limitation is imposed upon the thickness of each of the bottom electrode 12 and the top electrode 14. However, the thickness of each of the bottom electrode 12 and the top electrode 14 should preferably fall within the range of 50 nm to 500 nm.

A piezoelectric actuator (acting as the piezoelectric apparatus in accordance with the present invention) 2 is provided with the piezoelectric device 1. The piezoelectric actuator 2 is also provided with a vibrating plate 16, which is secured to a rear surface of the base plate 11 of the piezoelectric device 1 and is capable of being vibrated by expansion and contraction of the piezoelectric body 13. The piezoelectric actuator 2 is further provided with control means 15, which may be constituted of, for example, an actuation circuit for actuating the piezoelectric device 1.

An ink jet type recording head (acting as the liquid discharge apparatus in accordance with the present invention) 3 approximately has a constitution, in which an ink nozzle (acting as the liquid storing and discharging member) 20 is secured to a rear surface of the piezoelectric actuator 2. The ink nozzle 20 comprises an ink chamber (acting as the liquid storing chamber) 21, in which ink is to be stored. The ink nozzle 20 also comprises an ink discharge opening (acting as the liquid discharge opening) 22, through which the ink is to be discharged from the ink chamber 21 to the exterior of the ink chamber 21.

The ink jet type recording head 3 is constituted such that the piezoelectric device 1 is expanded or contracted through alteration of the electric field applied across the piezoelectric device 1, and such that the discharge of the ink from the ink chamber 21 and the quantity of the ink discharged from the ink chamber 21 are thereby controlled.

In lieu of the vibrating plate 16 and the ink nozzle 20 are secured as the independent members to the base plate 11, a part of the base plate 11 may be processed to form the vibrating plate 16 and the ink nozzle 20. For example, in cases where the base plate 11 is constituted of the laminate base plate, such as the SOI base plate, etching processing may be performed on the base plate 11 from the rear surface side of the base plate 11 in order to form the ink chamber 21, and the vibrating plate 16 and the ink nozzle 20 may be formed with processing of the base plate 11.

In this embodiment, the piezoelectric body 13 contains the inorganic compound polycrystal, which contains the first ferroelectric substance crystals having the crystal orientational characteristics at the time free from electric field application, and which has the characteristics such that, with electric field application of at least the predetermined electric field E1, at least a part of the first ferroelectric substance crystals undergoes the phase transition to the second ferroelectric substance crystals of the crystal system different from the crystal system of the first ferroelectric substance crystals.

Figure 12:
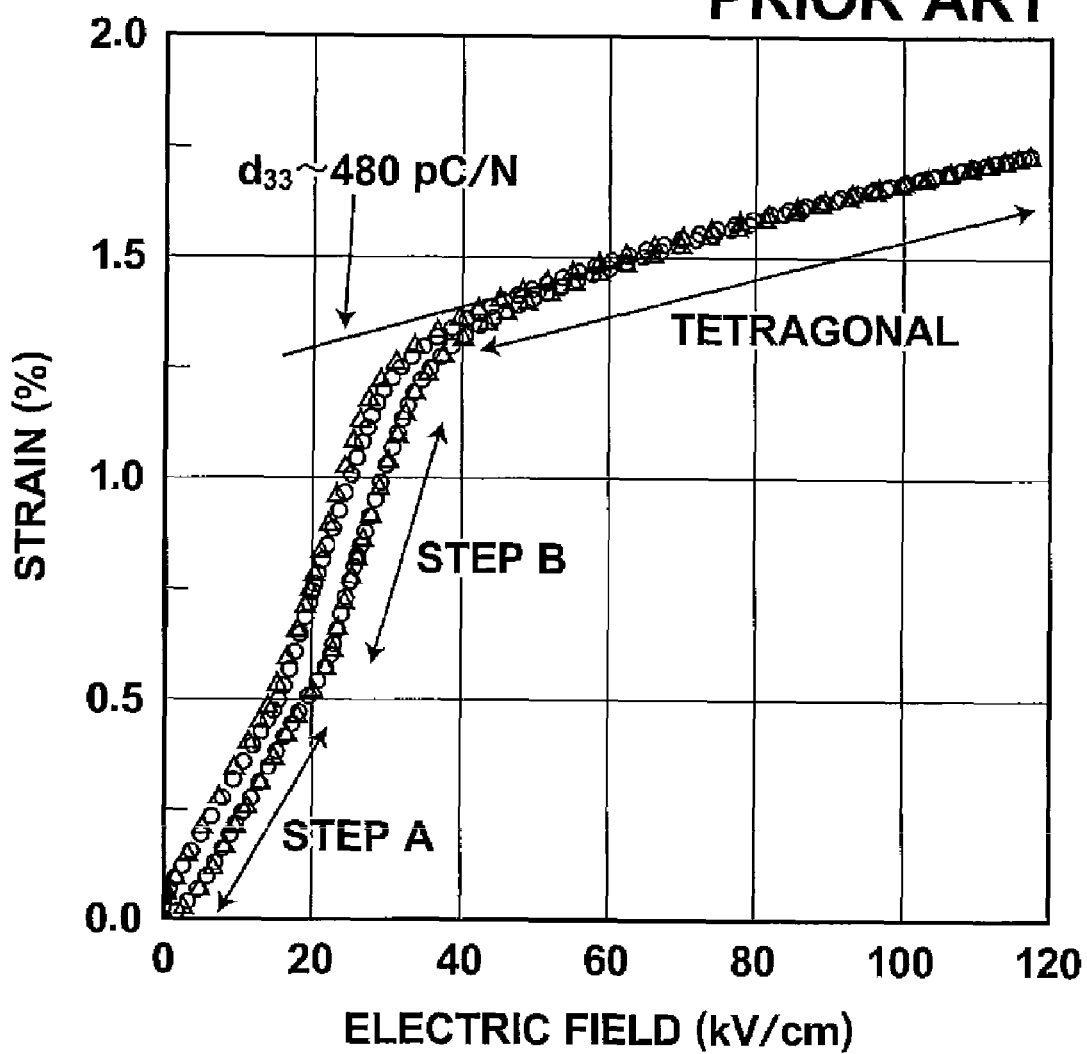
FIG. 12 is a graph showing an engineered domain effect of a PZN-8% PT single crystal.

In this embodiment, the piezoelectric characteristics (i.e., the relationship between the applied electric field and the strain displacement quantity) of the piezoelectric body 13 may be approximately represented by the curve P illustrated in FIG. 2. (Reference may be made to FIG. 12, which corresponds to FIG. 17 in "Ultra high strain and piezoelectric behavior in relax or based ferroelectric single crystals," S. E. Park, et al., JAP, 82, 1804 (1997).)

With reference to FIG. 2, the electric field E1 represents the minimum electric field at which the phase transition from the first ferroelectric substance crystals to the second ferroelectric substance crystals begins. Also, the electric field E2 represents the electric field at which the phase transition from the first ferroelectric substance crystals to the second ferroelectric substance crystals finishes approximately perfectly. Ordinarily, the relationship between E1 and E2 may be such that E1<E2. However, the relationship between E1 and E2 may often be such that E1=E2.

As illustrated in FIG. 2, the piezoelectric body 13 has the piezoelectric characteristics described below. Specifically, as for the range of the applied electric field E of 0 to E1 (i.e., at the stage before the phase transition occurs), by virtue of the piezoelectric effect of the first ferroelectric substance crystals, the strain displacement quantity increases linearly in accordance with the increase in applied electric field. Also, as for the range of the applied electric field E of E1 to E2, the volume change due to the change of the crystal structure accompanying the phase transition occurs, and the strain displacement quantity increases linearly in accordance with the increase in applied electric field and with an inclination larger than the inclination of the increase in strain displacement quantity as for the range of the applied electric field E of 0 to E1. Further, as for the range of the applied electric field E of E1≧E2 (i.e., at the stage after the phase transition has finished approximately perfectly), by virtue of the piezoelectric effect of the second ferroelectric substance crystals, the strain displacement quantity increases linearly in accordance with the increase in applied electric field.

With the piezoelectric body 13, the volume change due to the change of the crystal structure accompanying the phase transition arises (as for the range of the applied electric field E of E1 to E2). Also, the piezoelectric body 13 contains the ferroelectric substance crystals at both the stage before the phase transition occurs and the stage after the phase transition has occurred. Therefore, the piezoelectric effect of the ferroelectric substance is capable of being obtained at both the stage before the phase transition occurs and the stage after the phase transition has occurred. Accordingly, as for all of the range of the applied electric field E of 0 to E1, the range of the applied electric field E of E1 to E2, and the range of the applied electric field E of E≧E2, a large strain displacement quantity is capable of being obtained.

This embodiment is constituted in the manner described below. Specifically, the piezoelectric body 13 having the characteristics described is actuated by the control means 15 and under the conditions such that the minimum applied electric field Emin and the maximum applied electric field Emax satisfy Formula (1):

$$\text{Emin} < \text{E1} < \text{Emax} \tag{1}$$

More specifically, the minimum applied electric field Emin is set at a value falling within the range such that the phase transition does not occur. (The minimum applied electric field Emin may be 0.) Also, the maximum applied electric field Emax is set at a value falling within the range such that at least apart of the first ferroelectric substance crystals undergoes the phase transition. With the constitution described above, both the piezoelectric effect of the first ferroelectric substance crystals and the volume change due to the change of the crystal structure accompanying the phase transition of the piezoelectric body 13 are capable of being obtained. Therefore, a large strain displacement quantity is capable of being obtained.

Also, this embodiment should preferably be constituted in the manner described below. Specifically, the piezoelectric body 13 having the characteristics described should preferably be actuated under the conditions such that the minimum applied electric field Emin and the maximum applied electric field. Emax satisfy Formula (2):

$$\text{Emin} < \text{E1} \leq \text{E2} < \text{Emax} \tag{2}$$

More specifically, the minimum applied electric field Emin is set at a value falling within the range such that the phase transition does not occur. (The minimum applied electric field Emin may be 0.) Also, the maximum applied electric field Emax is set at a value falling within the range such that the first ferroelectric substance crystals approximately perfectly undergo the phase transition to the second ferroelectric substance crystals. With the constitution described above, all of the piezoelectric effect of the first ferroelectric substance crystals, the volume change due to the change of the crystal structure accompanying the phase transition of the piezoelectric body 13, and the piezoelectric effect of the second ferroelectric substance crystals are capable of being obtained. Therefore, the strain displacement quantity is capable of being enhanced even further. FIG. 2 shows the cases wherein the minimum applied electric field Emin and the maximum applied electric field Emax satisfy Formula (2) shown above.

Figure 11:
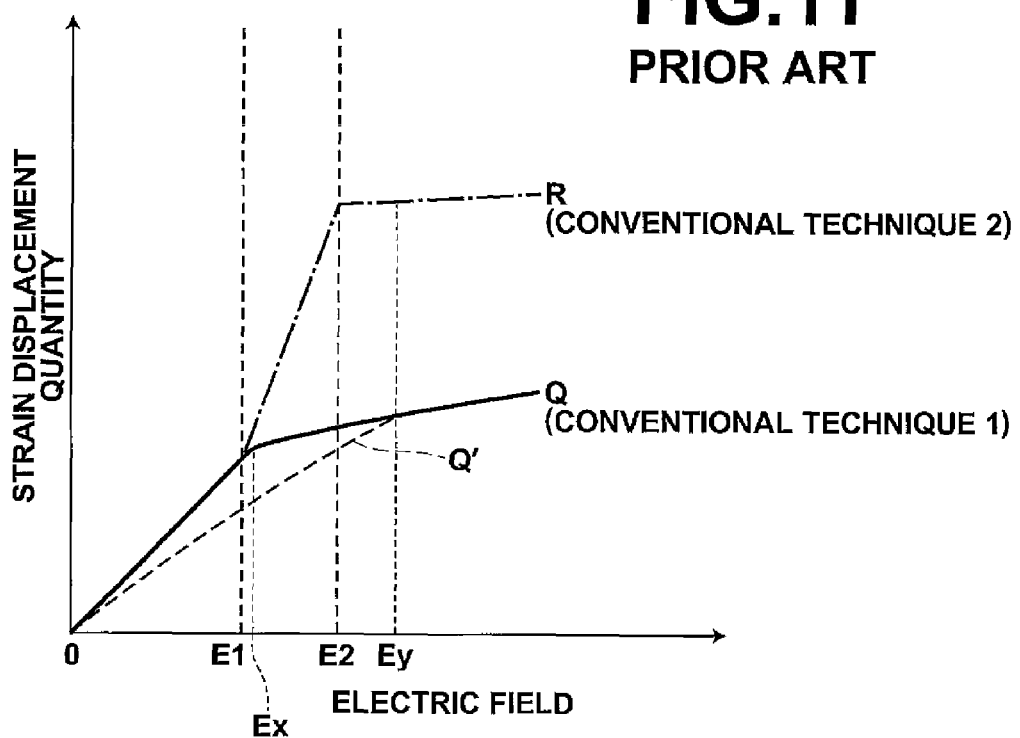
FIG. 11 is a graph showing piezoelectric characteristics of piezoelectric bodies constituting conventional piezoelectric devices.

As described above, the conventional piezoelectric devices (the aforesaid conventional technique 1), in which only the piezoelectric effect of the ferroelectric substance is utilized, have the piezoelectric characteristics described below. Specifically, as illustrated in FIG. 11, as for the applied electric field range of zero to the certain applied electric field Ex, the strain displacement quantity increases linearly with respect to the increase in applied electric field. Also, as for the applied electric field range higher than the certain applied electric field Ex, the increase in strain displacement quantity with respect to the increase in applied electric field becomes markedly small, and saturation is approximately reached in strain displacement quantity. Therefore, the conventional piezoelectric devices have been used with the applied electric field falling within the range of 0 to Ex, in which range the strain displacement quantity increases linearly with respect to the increase in applied electric field.

In cases where a comparison is made between the piezoelectric body 13 of the piezoelectric device 1 in accordance with the present invention and the piezoelectric bodies of the aforesaid conventional technique 1, which piezoelectric bodies have compositions represented by similar chemical formulas, the phase transition of the piezoelectric body 13 begins before the stage at which, in the cases of the aforesaid conventional technique 1, saturation is approximately reached in strain displacement quantity. (Specifically, in the cases of the piezoelectric body 13, E1 takes a value satisfying E1≦Ex.)

This embodiment of the piezoelectric device 1 is actuated under the conditions such that the maximum applied electric field Emax (>E1) is identical with or higher than the maximum applied electric field for the conventional piezoelectric devices (the aforesaid conventional technique 1), in which only the piezoelectric effect of the ferroelectric substance is utilized. Therefore, the piezoelectric device 1 in accordance with the present invention is applicable also to a thin type piezoelectric device, in which a high applied electric field arises in cases where a voltage of the level identical with the level in the conventional techniques is applied across the piezoelectric body.

The composition of the piezoelectric body 13 may be selected from a wide variety of compositions, which satisfy the crystal conditions described above. By way of example, the piezoelectric body 13 may contain at least one kind of perovskite type oxide, which may contain inevitable impurities.

In such cases, the piezoelectric body 13 should preferably contain at least one kind of perovskite type oxide, which may contain inevitable impurities, the perovskite type oxide being represented by the general formula:

wherein A represents the element at the A site and represents at least one kind of element selected from the group consisting of Pb, Ba, La, Sr, Bi, Li, Na, Ca, Cd, Mg, and K, B represents the element at the B site and represents at least one kind of element selected from the group consisting of Ti, Zr, V, Nb, Ta, Cr, Mo, W, Mn, Sc, Co, Cu, In, Sn, Ga, Zn, Cd, Fe, Ni, and lanthanide elements, and O represents the oxygen atom, the standard composition being such that the number of mols of the A site element is 1.0, and at the same time the number of mols of the B site element is 1.0, with the proviso that each of the number of mols of the A site element and the number of mols of the B site element may deviate from 1.0 within a range such that the perovskite structure is capable of being attained.

Examples of the perovskite type oxides, which may be represented by the general formula shown above, include lead-containing compounds, such as lead titanate, lead zirconate titanate (PZT), lead zirconate, lead lanthanum titanate, lead lanthanum zirconate titanate, magnesium niobate lead zirconate titanate, nickel niobate lead zirconate titanate, and zinc niobate lead zirconate titanate; mixed crystal systems of the above-enumerated lead-containing compounds; lead-free compounds, such as barium titanate, strontium barium titanate, bismuth sodium titanate, bismuth potassium titanate, sodium niobate, potassium niobate, and lithium niobate; and mixed crystal systems of the above-enumerated lead-free compounds.

Such that good electric characteristics may be obtained, the piezoelectric body 13 should preferably contain at least one kind of metal ion selected from the group consisting of Mg, Ca, Sr, Ba, Bi, Nb, Ta, W, and Ln, where Ln represents lanthanide elements (La, Ce, Pr, Nd, Sm, Eu, Cd, Tb, Dy, Ho, Er, Tm, Yb, and Lu).

The crystals of PZT, or the like, take one of three kinds of crystal systems, i.e., the cubic system, the tetragonal system, and the rhombohedral system. Also, barium titanate, or the like, taken one of four kinds of crystal systems, i.e., the cubic system, the tetragonal system, the orthorhombic system, and the rhombohedral system.

The cubic system crystals constitute the para electric substance. Therefore, the first ferroelectric substance crystals take on the form of the tetragonal system crystals, the orthorhombic system crystals, or the rhombohedral system crystals. Also, the second ferroelectric substance crystals take on the form of the tetragonal system crystals, orthorhombic system crystals, or the rhombohedral system crystals and are of the crystal system different from the crystal system of the first ferroelectric substance crystals. As described above, the crystals of PZT, or the like, do not take on the form of the orthorhombic system crystals. Therefore, in the cases of PZT, or the like, the combination of the kind of the first ferroelectric substance crystals and the kind of the second ferroelectric substance crystals is such that one of the first ferroelectric substance crystals and the second ferroelectric substance crystals may be of the tetragonal system, and such that the other ferroelectric substance crystals may be of the rhombohedral system.

Ordinarily, Gibbs free energy G of dielectric substances, including the ferroelectric substances, may be represented by the formula shown below, and the crystal system of a dielec tric substance having a certain composition is determined unitarily by a stress, an electric field, and a temperature.

$$G = U + X_i x_i - E_i P_i - TS$$

wherein U represents the internal energy, $X_i$ represents the stress, $x_i$ represents the strain, $E_i$ represents the electric field, $P_i$ represents the polarization, T represents the temperature, and S represents the entropy.

FIG. 3 is a graph showing relationships among the temperature T, the Gibbs free energy G, and the crystal systems of barium titanate ($BaTiO_3$). With reference to FIG. 3, in the cases of barium titanate, the phase transition temperature between the rhombohedral system and the orthorhombic system is approximately −80° C., the phase transition temperature between the orthorhombic system and the tetragonal system is approximately 10° C., and the phase transition temperature between the tetragonal system and the cubic system is approximately 120° C. In the cases of PZT, the relationships among the temperature T, the Gibbs free energy G, and the crystal systems are basically identical with the relationship illustrated in FIG. 3, except that the crystals of PZT do not take the orthorhombic system.

The form of the piezoelectric body 13 may be designed in various ways. For example, the piezoelectric body 13 may take on the form of a film. Alternatively, the piezoelectric body 13 may take on the form of a sintered body. This embodiment of the piezoelectric device 1 is efficient particularly in cases where the piezoelectric body 13 takes on the form of a piezoelectric film having a thickness of at most 20 μm. In this embodiment, regardless of the form of the piezoelectric body 13, the piezoelectric body 13 is formed such that the first ferroelectric substance crystals before undergoing the phase transition have the crystal orientational characteristics. Examples of the piezoelectric body 13 formed in the manner described above include an orientational film (i.e., a film having the uniaxial orientational characteristics), an epitaxial film (i.e., a film having the triaxial orientational characteristics), and a particulate orientational ceramics sintered body.

The orientational film is capable of being formed with a process, in which the film formation is performed under the conditions, such that the uniaxial orientational crystals may be formed, by use of a known thin film forming technique. Examples of the known thin film forming techniques include vapor phase techniques, such as a sputtering technique, an MOCVD technique, and a pulsed laser deposition technique; and liquid phase techniques, such as a sol-gel technique and an organometallic compound decomposition technique. For example, in cases where (100) orientation is to be obtained, Pt having undergone the (100) orientation, or the like, may be utilized as the bottom electrode. (Reference may be made to Example 1, which will be described later.)

The epitaxial film is capable of being formed by the utilization of materials, which have good lattice matching characteristics with respect to the piezoelectric film, as the materials for the base plate and the bottom electrode. Examples of appropriate combinations of the base plate materials/bottom electrode materials, with which the epitaxial film is capable of being formed, include $SrTiO_3$/$SrRuO_3$ and MgO/Pt.

The particulate orientational ceramics sintered body is capable of being formed with a hot pressing technique, a sheeting technique, a laminate pressing technique in which a plurality of sheets obtained with the sheeting technique are laminate pressed, or the like.

With this embodiment of the piezoelectric device 1, the first ferroelectric substance crystals, which are the ferroelectric substance crystals before undergoing the phase transition, are the orientational crystals. Therefore, as for the range of the applied electric field E of 0 to E1 (i.e., at the stage before the phase transition occurs), the piezoelectric effect of the first ferroelectric substance crystals arises uniformly and reliably over the entire region of the piezoelectric body 13. Also, as for the range of the applied electric field E of E1 to E2, the phase transition from the first ferroelectric substance crystals to the second ferroelectric substance crystals proceeds reliably over the entire region of the piezoelectric body 13. Further, as for the range of the applied electric field E of E≧E2 (i.e., at the stage after the phase transition has finished approximately perfectly), the piezoelectric effect of the second ferroelectric substance crystals arises uniformly and reliably over the entire region of the piezoelectric body 13. Accordingly, in both the cases wherein the piezoelectric device 1 is actuated under the conditions satisfying Formula (1) shown above and the cases wherein the piezoelectric device 1 is actuated under the conditions satisfying Formula (2) shown above, a large strain displacement quantity is capable of being obtained reliably.

The aforesaid constitution of this embodiment of the piezoelectric device 1 is advantageous over the cases, wherein bulk single crystals are utilized, from the viewpoint of production easiness, a low cost, high flexibility in shape design, and the like. Also, in cases where the thickness of the piezoelectric device 1 is set to be thin, since a single crystal base plate requiring a high cost need not be utilized, the flexibility in selection of the base plate is capable of being kept high. The high flexibility in selection of the base plate is advantageous from the view point of a low cost, high flexibility in selection of a process, and the like.

As described above with reference to the conventional piezoelectric devices (the aforesaid conventional technique 1), in which only the piezoelectric effect of the ferroelectric substance is utilized, it has heretofore been regarded to be important that the electric field is applied in the direction matched with the polarization axis of the ferroelectric substance. If the aforesaid technique for applying the electric field in the direction matched with the polarization axis of the ferroelectric substance is directly applied to the system in this embodiment, in which the first ferroelectric substance crystals are caused to undergo the phase transition to the second ferroelectric substance crystals, the electric field will be applied in the direction matched with the polarization axis of the first ferroelectric substance crystals before undergoing the phase transition.

However, this embodiment should preferably be constituted such that, in lieu of the direction of the electric field application as in the conventional technique 1 being employed, the direction of the polarization axis of the first ferroelectric substance crystals is different from the direction of the electric field application by the bottom electrode 12 and the top electrode 14. With the constitution described above, the "engineered domain effect" is capable of being obtained.

The "engineered domain effect" is the effect such that, in cases where the direction of the polarization axis of the first ferroelectric substance crystals and the direction of the electric field application are set to be different from each other, a larger displacement quantity is capable of being obtained reliably than in cases where the direction of the electric field application is matched with the direction of the polarization axis of the first ferroelectric substance crystals.

Specifically, in cases where the direction of the polarization axis of the first ferroelectric substance crystals and the direction of the electric field application are set to be different from each other, as for the range of the applied electric field E of 0 to E1, the inclination of the increase in strain displacement quantity with respect to the increase in applied electric field, which inclination represents a piezoelectric constant, becomes larger by virtue of the engineered domain effect than in cases where the direction of the electric field application is matched with the direction of the polarization axis of the first ferroelectric substance crystals.

Also, with the constitution in which the direction of the polarization axis of the first ferroelectric substance crystals is different from the direction of the electric field application, particularly with the constitution in which the direction of the electric field application approximately coincides with the direction of the polarization axis of the second ferroelectric substance crystals, besides the "engineered domain effect" described above, further effects are capable of being obtained.

Specifically, the inventors have found that, in cases where the direction of the electric field application is set to be approximately identical with the direction of the polarization axis of the second ferroelectric substance crystals, which are formed after the phase transition has occurred, the phase transition from the first ferroelectric substance crystals to the second ferroelectric substance crystals having the polarization axis different from the polarization axis of the first ferroelectric substance crystals is capable of proceeding most efficiently. This will presumably since the state, in which the polarization axis and the direction of the electric field application are matched with each other, is favorable for a high crystallographic stability, and the first ferroelectric substance crystals are apt to undergo the phase transition to the second ferroelectric substance crystals having an enhanced stability.

It may often occur that, in cases where an electric field higher than the applied electric field E2 is applied across the piezoelectric body 13, a part of the first ferroelectric substance crystals remains as the first ferroelectric substance crystals without undergoing the phase transition to the second ferroelectric substance crystals. However, since the phase transition from the first ferroelectric substance crystals to the second ferroelectric substance crystals proceeds efficiently, the proportion of the part of the first ferroelectric substance crystals, which part remains as the first ferroelectric substance crystals without undergoing the phase transition to the second ferroelectric substance crystals in cases where an electric field higher than the applied electric field E2 is applied across the piezoelectric body 13, is capable of being kept small. It is also possible that all of the first ferroelectric substance crystals are reliably caused to undergo the phase transition to the second ferroelectric substance crystals. As a result, as for the range of the applied electric field E of E1 to E2, a larger displacement quantity is capable of being obtained reliably than in cases where the direction of the electric field application is matched with the direction of the polarization axis of the first ferroelectric substance crystals.

Also, after the phase transition to the second ferroelectric substance crystals has occurred, the direction of the electric field application approximately coincides with the direction of the polarization axis of the second ferroelectric substance crystals. Therefore, as for the range of the applied electric field E of E≧E2, the piezoelectric effect of the second ferroelectric substance crystals arises efficiently, and a larger displacement quantity is capable of being obtained reliably than in cases where the direction of the electric field application is matched with the direction of the polarization axis of the first ferroelectric substance crystals.

The effects described above are capable of being obtained at least in cases where the direction of the polarization axis of the first ferroelectric substance crystals is different from the direction of the electric field application. The effects described above are capable of being enhanced even further in cases where the direction of the electric field application is close to the direction of the polarization axis of the second ferroelectric substance crystals.

To sum up, the effects described under (a), (b), and (c) below are capable of being obtained in cases where the direction of the polarization axis of the first ferroelectric substance crystals and the direction of the electric field application are set to be different from each other, preferably in cases where the phase transition is performed such that the direction of the electric field application approximately coincides with the direction of the polarization axis of the second ferroelectric substance crystals.

(a) As for the range of the applied electric field E of 0 to E1, a large strain displacement quantity is capable of being obtained reliably by virtue of the "engineered domain effect."

(b) As for the range of the applied electric field E of E1 to E2, the phase transition proceeds efficiently, and therefore a large displacement quantity is capable of being obtained reliably.

(c) As for the range of the applied electric field E of E≧E2, the piezoelectric effect of the second ferroelectric substance crystals arises efficiently, and therefore a large displacement quantity is capable of being obtained reliably.

Specifically, as for every range of the applied electric field E, a large displacement quantity is capable of being obtained reliably.

Examples of the combinations of the first ferroelectric substance crystals and the second ferroelectric substance crystals, such that the direction of the electric field application approximately coincides with the direction of the polarization axis of the second ferroelectric substance crystals after the phase transition has occurred, will hereinbelow be described in detail.

The polarization axes of the ferroelectric substance crystals are as shown below.

Tetragonal system: <001>
Orthorhombic system: <110>
Rhombohedral system: <111>

Ordinarily, the direction of the electric field application is set in the thickness direction of the piezoelectric body 13 (the direction normal to the surface of the piezoelectric body 13, i.e., the direction of the orientation).

In cases where the aforesaid polarization axis is taken into consideration, examples of the combinations of the first ferroelectric substance crystals and the second ferroelectric substance crystals, such that the direction of the electric field application (the direction of the orientation) approximately coincides with the direction of the polarization axis of the second ferroelectric substance crystals after the phase transition has occurred, include the combinations (1) to (6) shown below.

(1) A combination, in which the first ferroelectric substance crystals are the rhombohedral system crystals having the crystal orientational characteristics in an approximately <001> direction, and the second ferroelectric substance crystals are the tetragonal system crystals.

(2) A combination, in which the first ferroelectric substance crystals are the tetragonal system crystals having the crystal orientational characteristics in an approximately <111> direction, and the second ferroelectric substance crystals are the rhombohedral system crystals.

(3) A combination, in which the first ferroelectric substance crystals are the orthorhombic system crystals having the crystal orientational characteristics in an approximately <001> direction, and the second ferroelectric substance crystals are the tetragonal system crystals.

(4) A combination, in which the first ferroelectric substance crystals are the tetragonal system crystals having the crystal orientational characteristics in an approximately <110> direction, and the second ferroelectric substance crystals are the orthorhombic system crystals.

(5) A combination, in which the first ferroelectric substance crystals are the rhombohedral system crystals having the crystal orientational characteristics in an approximately <110> direction, and the second ferroelectric substance crystals are the orthorhombic system crystals.

(6) A combination, in which the first ferroelectric substance crystals are the orthorhombic system crystals having the crystal orientational characteristics in an approximately <111> direction, and the second ferroelectric substance crystals are the rhombohedral system crystals.

Basically, this embodiment of the piezoelectric device 1 should preferably be designed such that the phase transition of the piezoelectric body 13 from the first ferroelectric substance crystals to the second ferroelectric substance crystals may be performed only with the alteration of the applied electric field. Specifically, the selection of the composition of the piezoelectric body 13 and the selection of the crystal systems, between which the phase transition takes place, should preferably be made such that the piezoelectric body 13 may have the phase transition temperature at the service ambient temperature. However, when necessary, a temperature adjustment may be performed such that the device temperature may become equal to the phase transition temperature. In cases where the piezoelectric device 1 is thus actuated at the phase transition temperature or at a temperature in the vicinity of the phase transition temperature, the phase transition from the first ferroelectric substance crystals to the second ferroelectric substance crystals is capable of occurring efficiently.

Heretofore, the conventional piezoelectric devices have ordinarily been used at normal temperatures and have therefore been designed on the assumption that the piezoelectric devices are used at normal temperatures. However, hereafter, there will be the possibility of the piezoelectric devices being used under ambient conditions of temperatures higher than normal temperatures. (For example, in use applications around engines of automobiles, around CPU's, and the like, the service ambient temperature of the piezoelectric devices may be at least 80° C. Also, in use applications to ink jet type recording heads, in order for the ink viscosity to be reduced, the service ambient temperature of the piezoelectric devices may fall within the range of 40° C. to 80° C. Further, there will be the possibility of the piezoelectric devices being used under ambient conditions of temperatures lower than normal temperatures (for example, in use applications to refrigerators). Specifically, the materials for the piezoelectric devices should preferably be designed with the service ambient temperatures of −50° C. to +200° C. being taken into consideration.

In this embodiment, in cases where the service ambient temperatures described above are taken into consideration, the phase transition temperature, at which the phase transition from the first ferroelectric substance crystals of the piezoelectric body to the second ferroelectric substance crystals occurs, should preferably fall within the range of −50° C. to +200° C.

Under the conditions such that the service ambient temperature is equal to the phase transition temperature, in the cases of PZT and in the cases of (1) the combination, in which the first ferroelectric substance crystals are the rhombohedral system crystals having the crystal orientational characteristics in an approximately <001> direction, and in which the second ferroelectric substance crystals are the tetragonal system crystals, the electric field E1 may fall within the range of approximately 10 kV/cm to approximately 150 kv/cm, depending upon the composition and the thickness, and the electric field E2 may fall within the range of approximately 30 kV/cm to approximately 300 kV/cm, depending upon the composition and the thickness.

In cases where a comparison is made between the piezoelectric device 1 provided with the piezoelectric body 13 in accordance with the present invention and the piezoelectric devices of the aforesaid conventional technique 1 provided with the piezoelectric bodies, which piezoelectric bodies have compositions represented by similar chemical formulas, this embodiment of the piezoelectric device 1 is actuated under the conditions such that the maximum applied electric field Emax (>E1) (e.g., the maximum applied electric field Emax of at least 100 kV/cm) is identical with or higher than the maximum applied electric field (ordinarily falling within the range of approximately 0.1 kV/cm to approximately 10 kV/cm) for the conventional piezoelectric devices (the aforesaid conventional technique 1), in which only the piezoelectric effect of the ferroelectric substance is utilized. Therefore, the piezoelectric device 1 in accordance with the present invention is applicable also to a thin type piezoelectric device, in which a high applied electric field arises in cases where a voltage of the level identical with the level in the conventional techniques is applied across the piezoelectric body.

Kinds of stress exerted upon thin films include the internal stress occurring at the time of film formation and the stress due to the difference in coefficient of thermal expansion between the film and the base plate. Ordinarily, the material design may be made such that the stress exerted upon the thin film may fall within the range of −10 GPa to +10 GPa.

In the embodiment described above, the piezoelectric body 13 is constituted of the polycrystal, which consists of the first ferroelectric substance crystals at the time free from electric field application. Alternatively, the piezoelectric body 13 may be constituted of the polycrystal, which contains a mixture of the first ferroelectric substance crystals and other ferroelectric substance crystals of a crystal system different from the crystal system of the first ferroelectric substance crystals at the time free from electric field application. In cases where the piezoelectric body 13 is constituted of the polycrystal, which contains the mixture of the first ferroelectric substance crystals and other ferroelectric substance crystals of a crystal system different from the crystal system of the first ferroelectric substance crystals at the time free from electric field application, the piezoelectric strain, which occurs by virtue of the engineered domain effect of the first ferroelectric substance crystals, and the strain displacement, which occurs by virtue of the volume change accompanying the phase transition from the first ferroelectric substance crystals to the second ferroelectric substance crystals, are capable of being obtained.

This embodiment of the piezoelectric device 1 comprises the piezoelectric body 13 containing the inorganic compound polycrystal, which contains the first ferroelectric substance crystals having the crystal orientational characteristics at the time free from electric field application, and which has the characteristics such that, with electric field application of at least the predetermined electric field E1, at least a part of the first ferroelectric substance crystals undergoes the phase transition to the second ferroelectric substance crystals of the crystal system different from the crystal system of the first ferroelectric substance crystals. This embodiment of the piezoelectric device 1 is actuated under the conditions such that the minimum applied electric field Emin and the maximum applied electric field Emax satisfy Formula (1) shown above. This embodiment of the piezoelectric device 1 should preferably be actuated under the conditions such that the minimum applied electric field Emin and the maximum applied electric field Emax satisfy Formula (2) shown above.

With this embodiment of the piezoelectric device 1, the volume change due to the change of the crystal structure accompanying the phase transition of the piezoelectric body 13 is capable of being obtained. Also, the piezoelectric body 13 contains the ferroelectric substance crystals at both the stage before the phase transition occurs and the stage after the phase transition has occurred. Therefore, the piezoelectric effect of the ferroelectric substance is capable of being obtained at both the stage before the phase transition occurs and the stage after the phase transition has occurred. Accordingly, in both the cases wherein the piezoelectric device is actuated under the conditions satisfying Formula (1) shown above and the cases wherein the piezoelectric device is actuated under the conditions satisfying Formula (2) shown above, a large strain displacement quantity is capable of being obtained as a whole.

With this embodiment of the piezoelectric device 1, the first ferroelectric substance crystals, which are the ferroelectric substance crystals before undergoing the phase transition, are the crystals having the crystal orientational characteristics. Therefore, the phase transition from the first ferroelectric substance crystals to the second ferroelectric substance crystals is capable of proceeding reliably, and the large strain displacement quantity is capable of being obtained reliably.

The aforesaid constitution of the piezoelectric device 1 is advantageous over the cases, wherein bulk single crystals are utilized, from the viewpoint of production easiness, a low cost, high flexibility in shape design, and the like. Also, in cases where the thickness of the piezoelectric device 1 is set to be thin, since a single crystal base plate requiring a high cost need not be utilized, the flexibility in selection of the base plate is capable of being kept high. The high flexibility in selection of the base plate is advantageous from the view point of a low cost, high flexibility in selection of a process, and the like.

This embodiment of the piezoelectric device 1 is actuated under the conditions such that the maximum applied electric field Emax is identical with or higher than the maximum applied electric field for the conventional piezoelectric devices, in which only the piezoelectric effect of the ferroelectric substance is utilized. Therefore, this embodiment of the piezoelectric device 1 is applicable also to a thin type piezoelectric device, in which a high applied electric field arises in cases where a voltage of the level identical with the level in the conventional techniques is applied across the piezoelectric body. Specifically, this embodiment of the piezoelectric device 1 is capable of coping with reduction in thickness.

This embodiment of the piezoelectric device 1 should preferably be modified such that the direction of the polarization axis of the first ferroelectric substance crystals is different from the direction of the electric field application by the electrodes. Particularly, this embodiment of the piezoelectric device 1 should preferably be modified such that the direction of the electric field application approximately coincides with the direction of the polarization axis of the second ferroelectric substance crystals. In such cases, the "engineered domain effect" arises, and the phase transition proceeds efficiently. Therefore, a large strain displacement quantity is capable of being obtained reliably.

[Ink Jet Type Recording System]

An example of an ink jet type recording system, in which the ink jet type recording head 3 of FIG. 1 is employed, will be described hereinbelow with reference to FIG. 4 and FIG. 5. FIG. 4 is a schematic view showing an example of an ink jet type recording system, in which the ink jet type recording head of FIG. 1 is employed. FIG. 5 is a plan view showing a part of the ink jet type recording system of FIG. 4.

With reference to FIG. 4 and FIG. 5, an ink jet type recording system 100 comprises a printing section 102, which is provided with a plurality of ink jet type recording heads (hereinbelow referred to simply as the heads) 3K, 3C, 3M, and 3Y. Each of the heads 3K, 3C, 3M, and 3Y is utilized for one of different ink colors. The ink jet type recording system 100 also comprises an ink stocking and loading section 114 for storing ink compositions, each of which is to be furnished to one of the heads 3K, 3C, 3M, and 3Y. The ink jet type recording system 100 further comprises a paper supply section 118 for supplying recording paper 116. The inkjet type recording system 100 still further comprises a de-curling processing section 120 for eliminating roll set curl of the recording paper 116 having been received from the paper supply section lit. The inkjet type recording system 100 also comprises a suction belt conveyor section 122, which is located so as to stand facing a nozzle bottom surface (i.e., an ink discharge surface) of the printing section 102. The suction belt conveyor section 122 conveys the recording paper 116, while flatness of the recording paper 116 is being kept. The inkjet type recording system 100 further comprises a print detecting section 124 for reading out the results of the printing performed with the printing section 102. The ink jet type recording system 100 still further comprises a paper discharge section 126 for discharging the printed recording paper (i.e., the printed paper) to the exterior of the ink jet type recording system 100.

Each of the heads 3K, 3C, 3M, and 3Y of the printing section 102 is constituted of the ink jet type recording head 3 illustrated in FIG. 1.

In the de-curling processing section 120, heat is given by a heating drum 130 to the recording paper 116 in the direction reverse to the direction of the roll set curl, and the de-curling processing is thereby performed.

As illustrated in FIG. 4, in the cases of the ink jet type recording system 100 utilizing the rolled paper, a cutter 128 is located at the stage after the de-curling processing section 120, and the rolled paper is cut by the cutter 128 into a desired size. The cutter 128 is constituted of a stationary blade 128A, which has a length equal to at least the width of the conveyance path for the recording paper 116, and a round blade 128B, which is capable of being moved along the stationary blade 128A. The stationary blade 128A is located on the side of the rear surface of the recording paper 116, which rear surface is opposite to the printing surface of the recording paper 116. Also, the round blade 126B is located on the side of the printing surface of the recording paper 116 with the conveyance path intervening between the stationary blade 128A and the round blade 128B. In the cases of a system utilizing cut paper sheets, the system need not be provided with the cutter 128.

The recording paper 116, which has been subjected to the de-curling processing and has then been cut into the desired size, is sent into the suction belt conveyor section 122. The suction belt conveyor section 122 has the structure, in which an endless belt 133 is threaded over two rollers 131 and 132. The suction belt conveyor section 122 is constituted such that at least a part of the suction belt conveyor section 122, which part stands facing the nozzle bottom surface of the printing section 102 and a sensor surface of the print detecting section 124, may constitute a horizontal surface (a flat surface).

The belt 133 has a width larger than the width of the recording paper 116. The belt 133 has a plurality of suction holes (not shown), which are open at the belt surface. Also, a suction chamber 134 is located within the space defined by the belt 133, which is threaded over the two rollers 131 and 132. Specifically, the suction chamber 134 is located at the position that stands facing the nozzle bottom surface of the printing section 102 and the sensor surface of the print detecting section 124. The region within the suction chamber 134 is evacuated into a negative pressure by use of a fan 135, and the recording paper 116 located on the belt 133 is thereby supported by suction on the belt 133.

Rotation power of a motor (not shown) is transferred to at least either one of the rollers 131 and 132, over which the belt 133 is threaded. The belt 133 is thus rotated clockwise in FIG. 4, and the recording paper 116 having been supported on the belt 133 is thereby conveyed toward the right in FIG. 4.

In the cases of brimless printing, or the like, it will occur that the ink composition clings to the belt 133 beyond the area of the recording paper 116. Therefore, a belt cleaning section 136 is located at a predetermined position on the side outward from the space defined by the belt 133 (specifically, at an appropriate position other than the printing region).

A heating fan 140 is located on the side upstream from the printing section 102 with respect to the paper conveyance path, which is formed by the suction belt conveyor section 122. The heating fan 140 blows dry air against the recording paper 116 before being subjected to the printing and thereby heats the recording paper 116. In cases where the recording paper 116 is thus heated just before the recording paper is subjected to the printing, the ink composition having been jetted out onto the recording paper 116 is capable of drying easily.

As illustrated in FIG. 5, the printing section 102 is constituted of the full-line type heads. Specifically, in the printing section 102, the line type heads having a length corresponding to a maximum paper width are located so as to extend in the direction (i.e., the main scanning direction), which is normal to the paper feed direction. Each of the heads 3K, 3C, 3M, and 3Y is constituted of the line type head provided with a plurality of ink discharge openings (of the nozzles), which are arrayed over a length at least longer than one side of the recording paper 116 of the maximum size to be processed by the ink jet type recording system 100.

The heads 3K, 3C, 3M, and 3Y corresponding to the ink colors are located in the order of black (K), cyan (C), magenta (M), and yellow (Y) from the upstream side with respect to the feed direction of the recording paper 116. The color ink compositions are discharged respectively from the heads 3K, 3C, 3M, and 3Y, while the recording paper 116 is being conveyed. A color image is thus recorded on the recording paper 116.

The print detecting section 124 may be constituted of, for example, a line sensor for imaging the results of the droplet jetting-out operation performed by the printing section 102. The print detecting section 124 thus detects discharge failures, such as nozzle clogging, in accordance with the droplet jetting-out image having been read out by the line sensor.

A post-drying section 142 is located at the stage after the print detecting section 124. The post-drying section 142 may be constituted of, for example, a heating fan for drying the printed image surface. At the stage before the ink composition having been jetted out onto the recording paper 116 dries, the printing surface should preferably be free from contact with a drying member, or the like. Therefore, the post-drying section 142 should preferably employ a drying technique for blowing hot air against the printing surface.

In order to control surface gloss of the image surface, a heating and pressure applying section 144 is located at the stage after the post-drying section 142. In the heating and pressure applying section 144, a pressure is applied to the image surface by a press roller 145 having a predetermined surface recess-protrusion pattern, while the image surface is being heated. The recess-protrusion pattern is thus transferred from the press roller 145 to the image surface.

The printed paper having thus been obtained is then discharged through the paper discharge section 126. Ordinarily, the printed paper, on which a regular image (an object image) to be recorded has been printed, and the printed paper, on which a test printing image has been printed, should preferably be discharged to different destinations. The ink jet type recording system 100 is provided with sorting means (not shown) for sorting out the printed paper, on which the regular image to be recorded has been printed, and the printed paper, on which the test printing image has been printed, and changing over the paper discharge paths to each other in order to send the printed paper, on which the regular image to be recorded has been printed, and the printed paper, on which the test printing image has been printed, into a discharge section 126A and a discharge section 126B, respectively.

In cases where both the regular image to be recorded and the test printing image are printed in parallel on a single large-sized paper sheet at the printing section 102, a cutter 148 may be located in order to separate the paper sheet region, on which the test printing image has been printed, from the paper sheet region, on which the regular image to be recorded has been printed.

The ink jet type recording system 100 is constituted in the manner described above.

EXAMPLES

The present invention will further be illustrated by the following non-limitative examples.

Example 1

A (100) Pt bottom electrode having a thickness of 0.2 μm was formed on a surface of a (100) MgO base plate by use of a sputtering technique. Thereafter, a $PbZr_{0.55}Ti_{0.45}O_3$ thin film having a thickness of 5 μm was formed as a piezoelectric body on the (100) Pt bottom electrode by use of a pulsed laser deposition technique. Also, a Pt top electrode having a thickness of 0.2 μm was formed on the $PbZr_{0.55}Ti_{0.45}O_3$ thin film. In this manner, a piezoelectric device in accordance with the present invention was obtained.

At the time at which the piezoelectric film described above had been formed, the obtained piezoelectric film was subjected to electric field application X-ray diffraction (electric field application XRD) measurements. With the measurements, it was confirmed that the piezoelectric film was constituted of rhombohedral system crystals (the first ferroelectric substance crystals) having the crystal orientational characteristics in the <001> direction at the time free from electric field application (orientation rate: 95%). It was also confirmed that, in cases where the electric field was applied in the <001> direction across the piezoelectric film, the rhombohedral system crystals (the first ferroelectric substance crystals) constituting the piezoelectric film underwent the phase transition to tetragonal system crystals (the second ferroelectric substance crystals). In Example 1, the direction of the electric field application coincided with the direction of the polarization axis of the second ferroelectric substance crystals after the phase transition has occurred.

The minimum electric field E1, at which the phase transition from the first ferroelectric substance crystals to the second ferroelectric substance crystals began, was equal to 110 kV/cm. Also, the electric field E2, at which the phase transition from the first ferroelectric substance crystals to the second ferroelectric substance crystals finished approximately perfectly, was equal to 160 kV/cm.

A piezoelectric constant $d_{31}$ with respect to the range of the minimum applied electric field Emin=50 kV/cm (<E1) to the maximum applied electric field Emax=200 kV/cm (>E2) was calculated with a technique utilizing a cantilever. The piezoelectric constant $d_{31}$ was found to be equal to 190 pm/V. In Example 1, the actuating conditions were the conditions such that the minimum applied electric field Emin and the maximum applied electric field Emax satisfied Formula (2) shown above.

Comparative Example 1

A piezoelectric device for comparison was prepared in the same manner as that in Example 1, except that a (111) MgO base plate was utilized in lieu of the (100) MgO base plate, and a (111) Pt bottom electrode was formed in lieu of the (100) Pt bottom electrode.

The obtained piezoelectric film was subjected to the electric field application XRD measurements in the same manner as that in Example 1. With the measurements, it was found that the piezoelectric film was constituted of rhombohedral system crystals having the crystal orientational characteristics in the <111> direction at the time free from electric field application (having been orientated in the direction of the polarization axis) (orientation rate: 90%). It was also confirmed that, in cases where the electric field was applied in the same manner as that in Example 1, the phase transition did not occur.

The piezoelectric constant $d_{31}$ with respect to the range of the minimum applied electric field Emin=50 kV/cm to the maximum applied electric field Emax=200 kV/cm was calculated in the same manner as that in Example 1. The piezoelectric constant $d_{31}$ was found to be equal to 120 pm/V.

Example 2

A $TiO_2$ adhesion layer having a thickness of 20 nm was formed on a surface of an $SiO_2$/Si base plate. Also, by use of the sputtering technique, a Pt bottom electrode having a thickness of 0.2 μm was formed on the surface of the $TiO_2$ adhesion layer having been formed on the surface of the $SiO_2$/Si base plate. Thereafter, a $PbZr_{0.46}Ti_{0.42}Nb_{0.12}O_3$ thin film having a thickness of 2.4 μm was formed as a piezoelectric body on the Pt bottom electrode by use of the sputtering technique. Further, a Pt top electrode having a thickness of 0.2 μm was formed on the $PbZr_{0.46}Ti_{0.42}Nb_{0.12}O_3$ thin film. In this manner, a piezoelectric device in accordance with the present invention was obtained.

The obtained piezoelectric film was subjected to the electric field application XRD measurements in the same manner as that in Example 1. With the measurements, it was confirmed that the piezoelectric film was constituted of rhombohedral system crystals (the first ferroelectric substance crystals) having the crystal orientational characteristics in the <001> direction at the time free from electric field application (orientation rate: 99%). It was also confirmed that, in cases where the electric field was applied in the <001> direction across the piezoelectric film, the rhombohedral system crystals (the first ferroelectric substance crystals) constituting the piezoelectric film underwent the phase transition to tetragonal system crystals (the second ferroelectric substance crystals). In Example 2, the direction of the electric field application coincided with the direction of the polarization axis of the second ferroelectric substance crystals after the phase transition has occurred. FIG. 6 shows an XRD pattern of the piezoelectric film, which was obtained in Example 2, at the time free from electric field application.

A diaphragm type piezoelectric device was obtained, and an electric field—displacement curve of the piezoelectric device was measured. In the electric field—displacement curve of the piezoelectric device, points of inflection, at which the inclination of the electric field—displacement curve altered, were found at the electric field E1, at which the phase transition began, and the electric field E2, at which the phase transition finished approximately perfectly. The minimum electric field E1, at which the phase transition from the first ferroelectric substance crystals to the second ferroelectric substance crystals began, was equal to 45 kV/cm. Also, the electric field E2, at which the phase transition from the first ferroelectric substance crystals to the second ferroelectric substance crystals finished approximately perfectly, was equal to 68 kV/cm. The thus obtained results coincided with the results of the electric field application XRD measurements having been obtained. In accordance with the electric field—displacement curve having been obtained and the results of the electric field application XRD measurements having been obtained, it was confirmed that the phase transition had occurred.

FIG. 7 shows an electric field—displacement curve, which was obtained in cases where the piezoelectric device having been obtained in Example 2 was actuated under the conditions of the minimum applied electric field Emin=0 kV/cm (<E1) to the maximum applied electric field Emax=60 kV/cm (>E1). The actuating conditions described above were the conditions such that the minimum applied electric field Emin and the maximum applied electric field Emax satisfied Formula (1) shown above and did not satisfy Formula (2) shown above.

Figure 8:
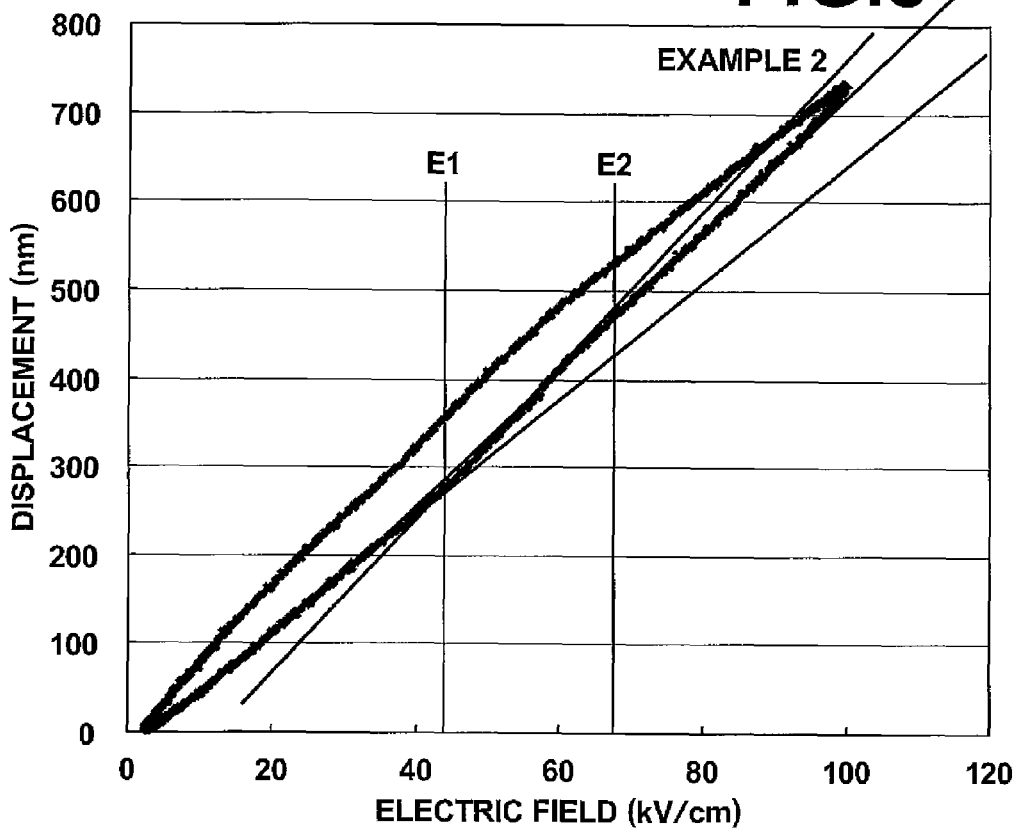
FIG. 8 is a graph showing an electric field—displacement curve, which was obtained in cases where the piezoelectric device having been obtained in Example 2 was actuated under conditions of Emin=0 kV/cm (<E1) to Emax=100 kV/cm (>E2)

FIG. 8 shows an electric field—displacement curve, which was obtained in cases where the piezoelectric device having been obtained in Example 2 was actuated under the conditions of the minimum applied electric field Emin=0 kV/cm (<E1) to the maximum applied electric field Emax=100 kV/cm (>E2). The actuating conditions described above were the conditions such that the minimum applied electric field Emin and the maximum applied electric field Emax satisfied Formula (2) shown above.

In accordance with results of a comparison made between FIG. 7 and FIG. 8, it was revealed that, in cases where the piezoelectric device was actuated under the conditions satisfying Formula (2), a larger displacement quantity was capable of being obtained than in cases where the piezoelectric device was actuated under the conditions satisfying Formula (1). A piezoelectric constant $d_{31}$ with respect to the range of the minimum applied electric field Emin=0 kV/cm (<E1) to the maximum applied electric field Emax=100 kV/cm (>E2) was calculated. The piezoelectric constant $d_{31}$ was found to be equal to 250 pm/V.

Comparative Example 2

A piezoelectric device for comparison was prepared in the same manner as that in Example 2, except that the composition of the piezoelectric film was set to be $PbZr_{0.42}Ti_{0.45}Nb_{0.12}O_3$.

Figure 9:
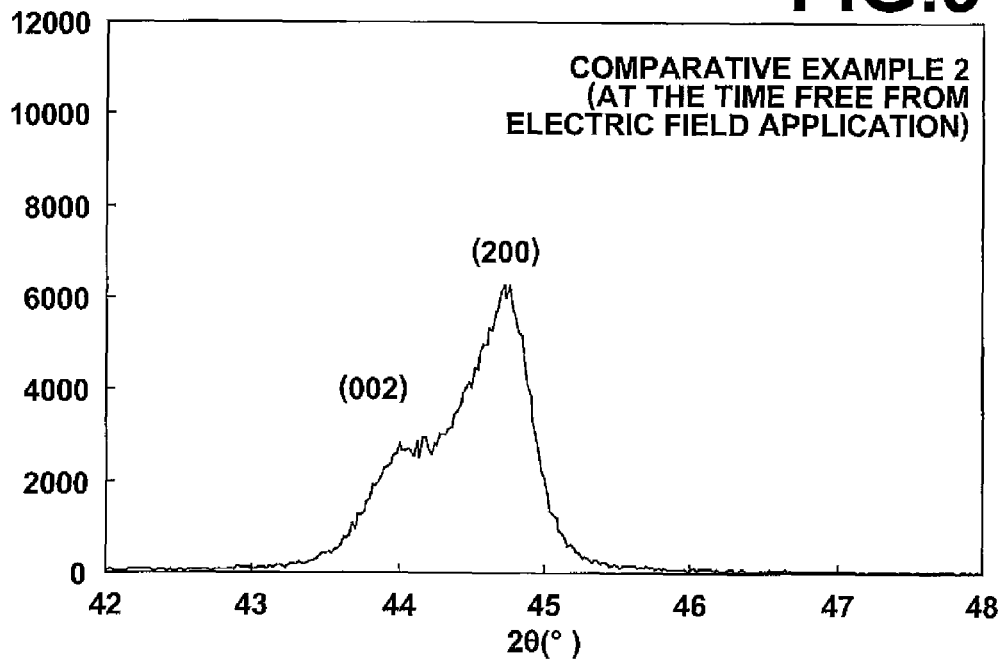
FIG. 9 is a graph showing an XRD pattern of a piezoelectric film, which was obtained in Comparative Example 2, at the time free from electric field application.

The obtained piezoelectric film was subjected to the electric field application XRD measurements in the same manner as that in Example 1. With the measurements, it was found that the piezoelectric film was constituted of tetragonal system crystals having the crystal orientational characteristics in the <100>/<001> direction at the time free from electric field application (having been orientated in the direction of the polarization axis) (orientation rate: at least 99%). It was also confirmed that, in cases where the electric field was applied in the same manner as that in Example 2, the phase transition did not occur. FIG. 9 shows an XRD pattern of the piezoelectric film, which was obtained in Comparative Example 2, at the time free from electric field application.

A diaphragm type piezoelectric device was obtained, and an electric field—displacement curve of the piezoelectric device was formed. Also, the piezoelectric constant $d_{31}$ with respect to the range of the minimum applied electric field Emin=0kV/cm to the maximum applied electric field Emax=100kV/cm was calculated in the same manner as that in Example 2. The piezoelectric constant $d_{31}$ was found to be equal to 150 pm/V.

Comparisons Between Examples 1, 2 and Comparative Examples 1, 2

A comparison was made between Example 1 and Comparative Example 1. Also, a comparison was made between Example 2 and Comparative Example 2. In accordance with the results of the comparisons, it was revealed that a large strain displacement quantity was capable of being obtained in cases where the piezoelectric device comprised the piezoelectric body containing the polycrystal, which contained the first ferroelectric substance crystals having the crystal orientational characteristics at the time free from electric field application, and which had the characteristics such that, with the electric field application of at least the predetermined electric field E1, at least a part of the first ferroelectric substance crystals underwent the phase transition to the second ferroelectric substance crystals of the crystal system different from the crystal system of the first ferroelectric substance crystals, and in cases where the piezoelectric device was actuated under the conditions such that the minimum applied electric field Emin and the maximum applied electric field Emax satisfied Formula (1), or preferably under the conditions such that the minimum applied electric field Emin and the maximum applied electric field Emax satisfied Formula (2).

Example 3

A piezoelectric device in accordance with the present invention was obtained in the same manner as that in Example 2, except that a $PbZr_{0.44}Ti_{0.44}Nb_{0.12}O_3$ thin film having a thickness of 5.0 μm was formed as a piezoelectric body on the bottom electrode by use of the sputtering technique and was then subjected to annealing processing at a temperature of 650° C. under an oxygen atmosphere, and the top electrode was then formed on the $PbZr_{0.44}Ti_{0.44}Nb_{0.12}O_3$ thin film. In this manner, a piezoelectric device in accordance with the present invention was obtained.

Figure 10:
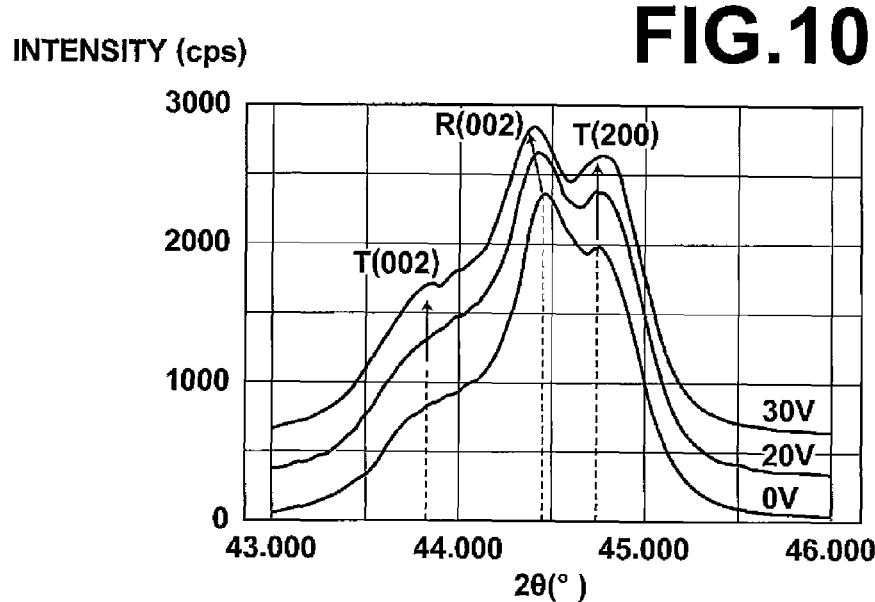
FIG. 10 is a graph showing results of electric field application XRD measurements made in Example 3.

The obtained piezoelectric film was subjected to the electric field application XRD measurements in the same manner as that in Example 1. With the measurements, it was confirmed that the piezoelectric film was constituted of a polycrystal, which contained a mixture of rhombohedral system crystals (the first ferroelectric substance crystals) having the crystal orientational characteristics in the <001> direction at the time free from electric field application and tetragonal system crystals having the crystal orientational characteristics in the <100>/<001> direction at the time free from electric field application. It was also confirmed that, in cases where the electric field was applied in the <001> direction across the piezoelectric film, a part of the rhombohedral system crystals (the first ferroelectric substance crystals) constituting the piezoelectric film underwent the phase transition to tetragonal system crystals (the second ferroelectric substance crystals). FIG. 10 shows the results of the electric field application XRD measurements made in Example 3. In FIG. 10, the reference letter T represents diffraction peaks of the tetragonal system crystals, and the reference letter R represents the diffraction peaks of the rhombohedral system crystals.

As illustrated in FIG. 10, as the applied electric field became high, the diffraction peak R(002) of the rhombohedral system crystals shifted. The shift of the diffraction peak R(002) of the rhombohedral system crystals represented that, as the applied electric field became high, the lattice of the rhombohedral system crystals elongated in the direction of the electric field application, and the lattice constant became large. (Specifically, the shift of the diffraction peak R(002) of the rhombohedral system crystals represented the piezoelectric strain due to the engineered domain effect.) Also, as illustrated in FIG. 10, as the applied electric field became high, the peak intensities of the diffraction peaks T(200) and T(002) of the tetragonal system crystals became high. The increases of the peak intensities of the diffraction peaks T(200) and T(002) of the tetragonal system crystals represented that, as the applied electric field became high, a part of the rhombohedral system crystals underwent the phase transition to the tetragonal system crystals.

In the same manner as that in Example 1, a piezoelectric constant $d_{31}$ with respect to the range of the minimum applied electric field Emin=0 kV/cm (<E1) to the maximum applied electric field Emax=100 kV/cm (>E2) was calculated with the technique utilizing the cantilever. The piezoelectric constant $d_{31}$ was found to be equal to 250 pm/V.

INDUSTRIAL APPLICABILITY

The piezoelectric device in accordance with the present invention is capable of being utilized appropriately for piezoelectric actuators for use in ink jet type recording heads, magnetic recording and reproducing heads, micro electromechanical systems (MEMS) devices, micro pumps, ultrasonic probes, and the like. The piezoelectric device in accordance with the present invention is also capable of being utilized appropriately for ferroelectric memories (FRAM's), and the like.

The invention claimed is:
1. A piezoelectric device, comprising:
i) a piezoelectric body, which has piezoelectric characteristics, and
ii) electrodes for applying an electric field in a predetermined direction across the piezoelectric body,
the piezoelectric body consisting of an inorganic compound polycrystal, which contains first ferroelectric substance crystals having crystal orientational characteristics at the time free from electric field application, and which has characteristics such that, with electric field application of at least a predetermined electric field E1, at least a part of the first ferroelectric substance crystals undergoes phase transition to second ferroelectric substance crystals of a crystal system different from the crystal system of the first ferroelectric substance crystals, the piezoelectric device being actuated under conditions such that a minimum applied electric field Emin and a maximum applied electric field Emax satisfy Formula (1):

$$Emin < E1 < Emax \quad (1)$$

wherein the electric field E1 represents the minimum electric field at which the phase transition from the first ferroelectric substance crystals to the second ferroelectric substance crystals begins.

2. A piezoelectric device as defined in claim 1 wherein the piezoelectric device is actuated under conditions such that the minimum applied electric field Emin and the maximum applied electric field Emax satisfy Formula (2):

$$Emin < E1 \leq E2 < Emax \quad (2)$$

wherein the electric field E2 represents the electric field at which the phase transition from the first ferroelectric substance crystals to the second ferroelectric substance crystals finishes approximately perfectly.

3. A piezoelectric device as defined in claim 1 wherein a direction of a polarization axis of the first ferroelectric substance crystals is different from the direction of the electric field application by the electrodes.

4. A piezoelectric device as defined in claim 3 wherein the direction of the electric field application approximately coincides with the direction of the polarization axis of the second ferroelectric substance crystals.

5. A piezoelectric device as defined in claim 1 wherein the first ferroelectric substance crystals are selected from the group consisting of tetragonal system crystals, orthorhombic system crystals, and rhombohedral system crystals, and the second ferroelectric substance crystals are selected from the group consisting of tetragonal system crystals, orthorhombic system crystals, and rhombohedral system crystals and are of the crystal system different from the crystal system of the first ferroelectric substance crystals.

6. A piezoelectric device as defined in claim 5 wherein the first ferroelectric substance crystals are the rhombohedral system crystals having the crystal orientational characteristics in an approximately <001> direction, and the second ferroelectric substance crystals are the tetragonal system crystals.

7. A piezoelectric device as defined in claim 5 wherein the first ferroelectric substance crystals are the tetragonal system crystals having the crystal orientational characteristics in an approximately <111> direction, and the second ferroelectric substance crystals are the rhombohedral system crystals.

8. A piezoelectric device as defined in claim 5 wherein the first ferroelectric substance crystals are the orthorhombic system crystals having the crystal orientational characteristics in an approximately <001> direction, and the second ferroelectric substance crystals are the tetragonal system crystals.

9. A piezoelectric device as defined in claim 5 wherein the first ferroelectric substance crystals are the tetragonal system crystals having the crystal orientational characteristics in an approximately <110> direction, and the second ferroelectric substance crystals are the orthorhombic system crystals.

10. A piezoelectric device as defined in claim 5 wherein the first ferroelectric substance crystals are the rhombohedral system crystals having the crystal orientational characteristics in an approximately <110> direction, and the second ferroelectric substance crystals are the orthorhombic system crystals.

11. A piezoelectric device as defined in claim 5 wherein the first ferroelectric substance crystals are the orthorhombic system crystals having the crystal orientational characteristics in an approximately <111> direction, and the second ferroelectric substance crystals are the rhombohedral system crystals.

12. A piezoelectric device as defined in claim 1 wherein the piezoelectric body contains at least one kind of perovskite type oxide, which may contain inevitable impurities.

13. A piezoelectric device as defined in claim 12 wherein the piezoelectric body contains at least one kind of perovskite type oxide, which may contain inevitable impurities, the perovskite type oxide being represented by the general formula:

general formula $ABO_3$ wherein A represents the element at the A site and represents at least one kind of element selected from the group consisting of Pb, Ba, La, Sr, Bi, Li, Na, Ca, Cd, Mg, and K, B represents the element at the B site and represents at least one kind of element selected from the group consisting of Ti, Zr, V, Nb, Ta, Cr, Mo, W, Mn, Sc, Co, Cu, In, Sn, Ga, Zn, Cd, Fe, Ni, and lanthanide elements, and O represents the oxygen atom, the standard composition being such that the number of mols of the A site element is 1.0, and at the same time the number of mols of the B site element is 1.0, with the proviso that each of the number of mols of the A site element and the number of mols of the B site element may deviate from 1.0 within a range such that the perovskite structure is capable of being formed.

14. A piezoelectric device as defined in claim 1 wherein a phase transition temperature, at which the phase transition from the first ferroelectric substance crystals of the piezoelectric body to the second ferroelectric substance crystals occurs, falls within the range of 50° C. to +200° C.

15. A piezoelectric device as defined in claim 1 wherein the piezoelectric body is a piezoelectric film having a film thickness of at most 20 µm.

16. A piezoelectric device as defined in claim 1 wherein the piezoelectric body contains a grain-oriented ceramics sintered body.

17. A method of actuating a piezoelectric device provided with:

i) a piezoelectric body, which has piezoelectric characteristics, and ii) electrodes for applying an electric field in a predetermined direction across the piezoelectric body, the piezoelectric body containing an inorganic compound polycrystal, which contains first ferroelectric substance crystals having crystal orientational characteristics at the time free from electric field application, and which has characteristics such that, with electric field application of at least a predetermined electric field E1, at least a part of the first ferroelectric substance crystals undergoes phase transition to second ferroelectric substance crystals of a crystal system different from the crystal system of the first ferroelectric substance crystals, the method comprising the steps of: actuating the piezoelectric device under conditions such that a minimum applied electric field Emin and a maximum applied electric field Emax satisfy Formula (1):

$$Emin < E1 < Emax \quad (1)$$

wherein the electric field E1 represents the minimum electric field at which the phase transition from the first ferroelectric substance crystals to the second ferroelectric substance crystals begins.

18. A method of actuating a piezoelectric device as defined in claim 17 wherein the piezoelectric device is actuated under conditions such that the minimum applied electric field Emin and the maximum applied electric field Emax satisfy Formula (2):

$$Emin < E1 \leq E2 < Emax \qquad (2)$$

wherein the electric field E2 represents the electric field at which the phase transition from the first ferroelectric substance crystals to the second ferroelectric substance crystals finishes approximately perfectly.

19. A piezoelectric apparatus, comprising:
i) a piezoelectric device provided with:
   a) a piezoelectric body, which has piezoelectric characteristics, and
   b) electrodes for applying an electric field in a predetermined direction across the piezoelectric body, and
ii) control means for controlling actuation of the piezoelectric device,
the piezoelectric body containing an inorganic compound polycrystal, which contains first ferroelectric substance crystals having crystal orientational characteristics at the time free from electric field application, and which has characteristics such that, with electric field application of at least a predetermined electric field E1, at least a part of the first ferroelectric substance crystals undergoes phase transition to second ferroelectric substance crystals of a crystal system different from the crystal system of the first ferroelectric substance crystals,
the control means actuating the piezoelectric device under conditions such that a minimum applied electric field Emin and a maximum applied electric field Emax satisfy Formula (1):

$$Emin < E1 < Emax \qquad (1)$$

wherein the electric field E1 represents the minimum electric field at which the phase transition from the first ferroelectric substance crystals to the second ferroelectric substance crystals begins.

20. A piezoelectric apparatus as defined in claim 19 wherein the control means actuates the piezoelectric device under conditions such that the minimum applied electric field Emin and the maximum applied electric field Emax satisfy Formula (2):

$$Emin < E1 \leq E2 < Emax \qquad (2)$$

wherein the electric field E2 represents the electric field at which the phase transition from the first ferroelectric substance crystals to the second ferroelectric substance crystals finishes approximately perfectly.

21. A liquid discharge apparatus, comprising:
i) a piezoelectric apparatus as defined in claim 19, and
ii) a liquid storing and discharging member provided with:
   a) a liquid storing chamber, in which a liquid is to be stored, and
   b) a liquid discharge opening, through which the liquid is to be discharged from the liquid storing chamber to the exterior of the liquid storing chamber.

* * * * *